(12) United States Patent
Ooishi

(10) Patent No.: US 6,999,342 B2
(45) Date of Patent: Feb. 14, 2006

(54) SEMICONDUCTOR DEVICE SAVING DATA IN NON-VOLATILE MANNER DURING STANDBY

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/119,937

(22) Filed: May 3, 2005

(65) Prior Publication Data

US 2005/0195664 A1 Sep. 8, 2005

Related U.S. Application Data

(62) Division of application No. 10/390,027, filed on Mar. 18, 2003, now Pat. No. 6,914,845.

(30) Foreign Application Priority Data

Oct. 8, 2002 (JP) .............................. 2002-295130

(51) Int. Cl.
*G11C 11/14* (2006.01)

(52) U.S. Cl. .................. 365/171; 365/154; 365/158; 365/205; 365/229

(58) Field of Classification Search ............... 365/154, 365/158, 171, 205, 209, 189.05, 229
See application file for complete search history.

(56) References Cited

U.S. PATENT DOCUMENTS 6,191,973 B1 2/2001 Moyer
6,324,093 B1 * 11/2001 Perner et al. ............... 365/171
6,343,032 B1 * 1/2002 Black et al. ................. 365/158
6,442,095 B1 * 8/2002 Ooishi ......................... 365/229
6,457,108 B1 9/2002 Hsu et al.
6,507,523 B1 1/2003 Pekny
6,643,209 B1 11/2003 Caulkins

FOREIGN PATENT DOCUMENTS

| JP | 04057291 A | 2/1992 |
| JP | 07226088 A | 8/1995 |
| JP | 2001057085 A | 2/2001 |

* cited by examiner

*Primary Examiner*—Anh Phung
*Assistant Examiner*—Toan Le
(74) *Attorney, Agent, or Firm*—McDermott Will & Emery LLP

(57) ABSTRACT

A power control unit activates a control signal ST for a circuit block to be set to a standby state before turning off power of the circuit block or a whole chip, and saves an operation result of data processing of the circuit block into a memory unit. When the power is again supplied to the circuit block in the standby state, the power control unit activates a control signal RES after the power supply is started and restores the data saved in the memory unit to the circuit block. Flip-flops in the circuit block are connected in series when the saving or restoring of data is performed, and perform a data transfer operation with a path different from that in a normal operation. Therefore, a semiconductor device can be provided which can rapidly transit to a standby mode having reduced current consumption while holding internal information.

3 Claims, 18 Drawing Sheets

WRITING DATA "0"

READING DATA "1"

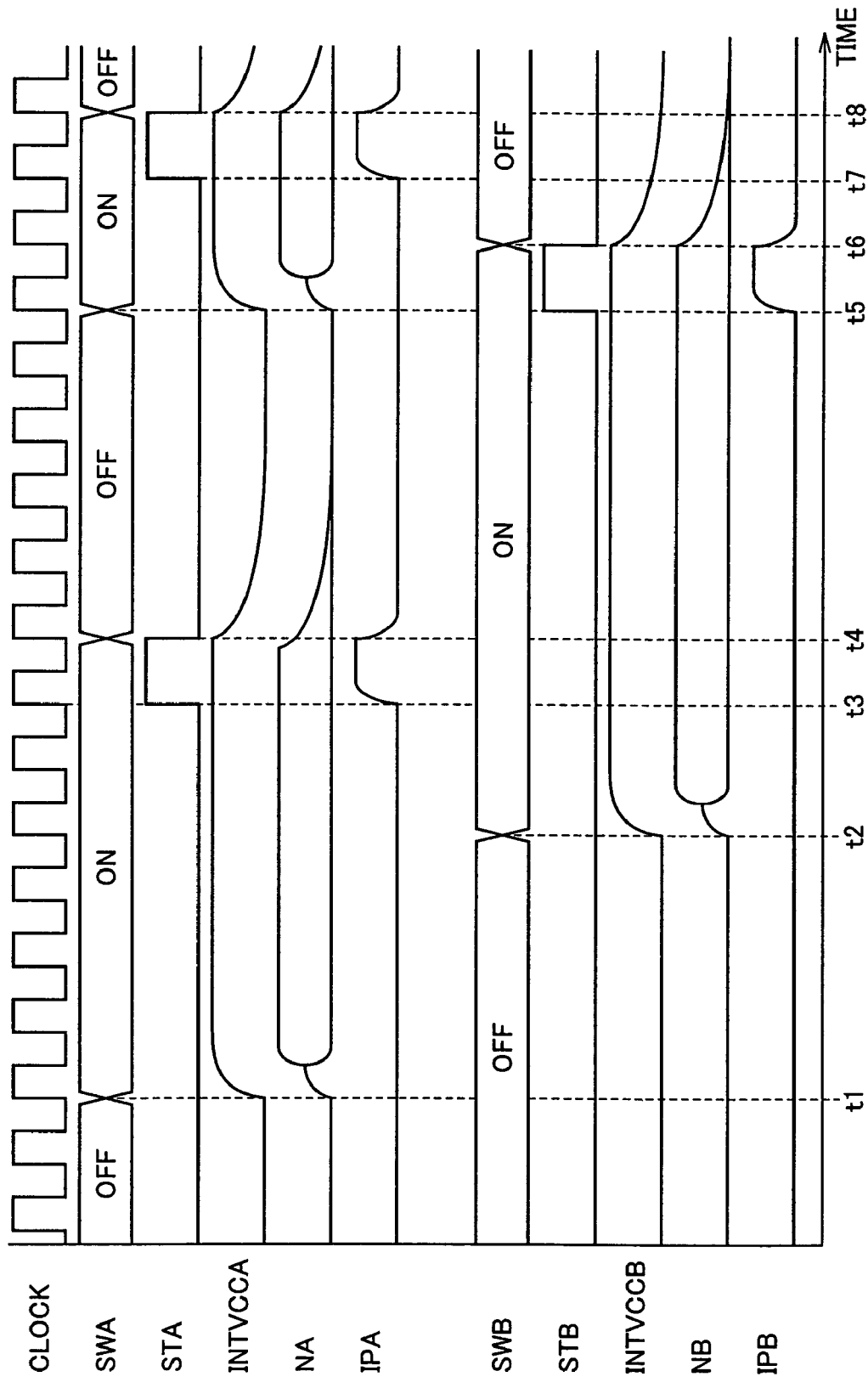

SEMICONDUCTOR DEVICE SAVING DATA IN NON-VOLATILE MANNER DURING STANDBY

RELATED APPLICATION

This application is a divisional of U.S. patent application Ser. No. 10/390,027, filed Mar. 18, 2003, now U.S. Pat. No. 6,914,845 which claims priority of Japanese application 2002-295130(P), filed Oct. 8, 2002, and the contents of which are hereby incorporated by reference.

BACKGROUND OF THE INVENTION

1. Field of the Invention

The present invention relates to a semiconductor device and, more specifically, to a semiconductor device which can save processed data in an integrated thin film magnetic memory element when power is turned off.

2. Description of the Background Art

In recent years, large-scale circuits can be integrated in a semiconductor device, and a system LSI (large-scale integrated circuit), in which a logic circuit and a bulk memory is integrated on one chip, has been developed. In such a system LSI, a logic circuit unit and a memory unit transmit and receive information such as address, command and data via a prescribed port.

With the objective of attaining higher performance, a gate oxide film of a transistor has been made thinner, and a gate length of a transistor has been reduced. With such a thinner gate oxide film, a gate leak current further increases. Reduction of the gate length also causes an increase in a leak current between source and drain of the transistor in an off-state.

One of solutions for the increase in the leak current is to turn off a power supply voltage during standby. When the power supply voltage is turned off, however, data of a flip-flop within a logic circuit or a volatile memory will be lost. Therefore, when the power supply voltage is turned off to reduce current consumption, the data is previously saved in a memory for saving, which is separately arranged on a printed-circuit board or the like on which the system LSI is mounted. An example of the memory for saving includes a flash EEPROM (electrically erasable programmable read only memory).

As a conventional semiconductor device, a semiconductor device is proposed in which non-volatility can be implemented while keeping a high speed property of a static memory (SRAM) (for example, see FIG. 1 on pages 3–4 in Japanese Patent Laying-Open No. 7-226088).

In this technique, a flip-flop is formed with two transistors, and two selection transistors are connected to the two transistors to form an SRAM memory cell unit. In addition, a non-volatile memory cell unit storing a state of the SRAM memory cell unit is formed with two non-volatile transistors each including two gates, that is, a floating gate and a control gate, and having a drain connected to a power supply line. The high speed property of the SRAM and non-volatility of an EPROM, a Flash-EPROM or the like can concurrently be implemented by connecting the non-volatile memory cell unit to the SRAM memory cell unit.

The flash EEPROM or the like which writes data to the floating gate, however, needs a time period of several milliseconds for a writing stage. Because of this very long time period, much processing time is required before the power supply voltage is turned off. As a result, a transition time to a standby mode for reducing current consumption will be late.

In addition, as the flash EEPROM also takes a relatively long time to read data, a long time period is needed to read data and return the data of the volatile memory or flip-flop to its original state after the power is reset. Thus, it also takes a long time to activate the device.

Further, it is uneconomical to provide a memory for temporary saving on an external printed-circuit board, because the number of elements in the whole system as well as an area of the external printed-circuit board increase.

SUMMARY OF THE INVENTION

An object of the present invention is to provide a semiconductor device which can rapidly transit to a standby mode wherein current consumption is reduced while holding internal information.

A semiconductor device according to the present invention has first and second modes as operation modes, and includes a memory unit storing data in a non-volatile manner and a logic circuit unit transmitting data to the memory unit using first and second data transfer paths respectively in the first and second modes. In response to a notice signal to change a power supply potential fed to the memory unit and the logic circuit unit from a standard operation potential to a standby potential, the logic circuit unit saves result information processed in the first mode into the memory unit using the second data transfer path in the second mode.

A semiconductor device according to another aspect of the present invention includes a data holding circuit. The data holding circuit includes a latch circuit holding data in a volatile manner, a write control circuit receiving hold information of the latch circuit and an activation signal, and a thin film magnetic memory cell receiving a current corresponding to the hold information from the write control circuit when the activation signal is in an active state and rewriting stored data in a non-volatile manner with a magnetic field corresponding to the current.

Therefore, a main advantage of the present invention is that, data can be saved without interrupting a normal operation by providing a transfer path for transferring data during data saving separately from a normal data transfer path, and current consumption during standby is reduced by changing a power supply potential from a normal operation potential to a standby potential.

Another advantage of the present invention is that, as the thin film magnetic memory cell is added to the volatile latch circuit, data can rapidly be saved without requiring a complex transfer operation when data of the latch circuit is to be saved, and current consumption during standby can efficiently be reduced by changing the power supply potential to the standby potential in the standby mode.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 20 is an operation waveform diagram for describing a power control operation of semiconductor device 201 shown in FIG. 11.

DESCRIPTION OF THE PREFERRED EMBODIMENTS

Figure 1:
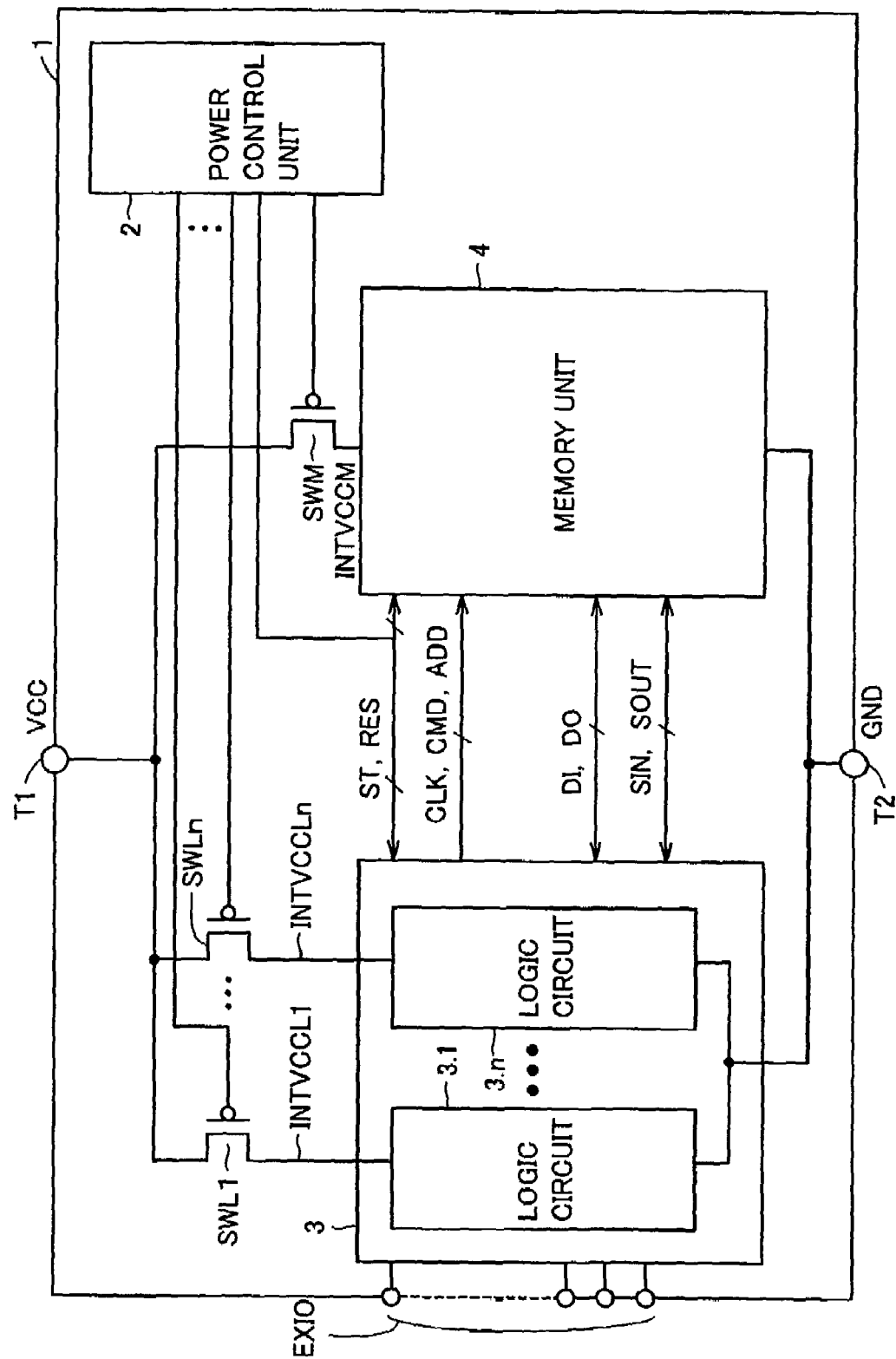
FIG. 1 is a schematic block diagram of a whole structure relating to a power control operation of a semiconductor device 1 of a first embodiment 1 according to the present invention.

Embodiments of the present invention will now be described in detail with reference to the drawings. Herein, the same characters in the drawings indicate the same or corresponding portions.

[First Embodiment]

FIG. 1 is a schematic block diagram of a whole structure relating to a power control operation of a semiconductor device 1 of a first embodiment 1 according to the present invention.

Referring to FIG. 1, semiconductor device 1 includes a power supply terminal T1 receiving a power supply potential VCC fed from the outside, a ground terminal T2 receiving a ground potential GND fed from the outside, and a terminal EXIO for communicating signals with the outside.

Semiconductor device 1 further includes a logic unit 3, a memory unit 4, switch circuits SWL1–SWLn and SWM, and a power control unit 2.

Logic unit 3 includes logic circuits 3.1–3.n. As will be described below, logic circuits 3.1–3.n include a circuit such as a flip-flop for temporarily storing data and a combinational circuit such as an AND circuit.

Power control unit 2 performs on/off controls of switch circuits SWL1–SWLn and SWM, and also outputs control signals ST, RES to logic unit 3 and memory unit 4.

During a normal operation, logic unit 3 performs a prescribed operation processing and outputs the result as a data input signal DI to memory unit 4. Logic unit 3 also receives a data output signal DO from memory unit 4 as data needed for the operation processing. Logic unit 3 outputs a clock signal CLK, a command signal CMD and an address signal ADD, which are needed for communicating data, to memory unit 4.

To reduce power consumption, power control unit 2 brings switch circuits SWL1–SWLn and SWM into conduction to respectively feed power supply potential VCC to logic circuits 3.1–3.n and memory unit 4 only when they are needed for the operation, and sets a circuit block which is not needed for the operation to a standby state by shutting off the power.

Before shutting off the power, power control unit 2 activates control signal ST for the circuit block to be set to the standby state, and saves the operation result obtained by data processing of the circuit block into memory unit 4.

When the power is again supplied to the circuit block in the standby state, power control unit 2 activates control signal RES after the power supply is started and restores the data saved in memory unit 4 in the circuit block.

When it is noticed from the outside that power supply potential VCC of a chip will be turned off, power control unit 2 sends control signal ST to logic circuits 3.1–3.n and saves the operation result obtained by data processing of these circuits to memory unit 4.

When power supply potential VCC set to an off-state is again supplied, power control unit 2 activates control signal RES after the power supply to logic circuits 3.1–3.n is started, and restores the data saved in memory unit 4 in logic circuits 3.1–3.n.

Figure 2:
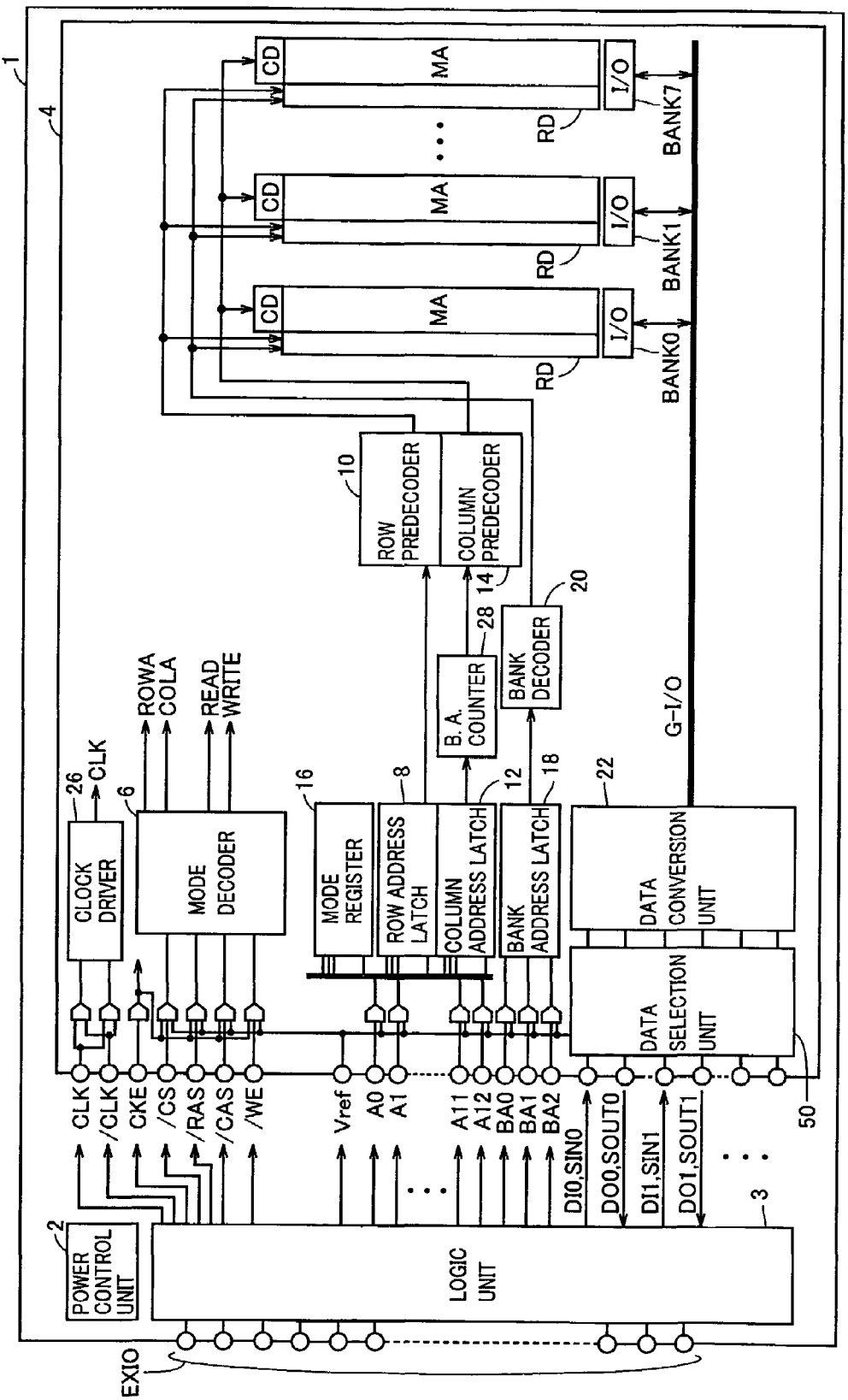
FIG. 2 is a block diagram of semiconductor device 1 indicating a structure of a memory unit 4 in further detail.

FIG. 2 is a block diagram of semiconductor device 1 indicating a structure of memory unit 4 in further detail.

Referring to FIG. 2, memory unit 4 is an MRAM (Magnetic Random Access Memory) which includes a tunneling magneto-resistance element described below as a memory cell.

Memory unit 4 receives from logic unit 3 complementary clock signals CLK, /CLK, an enable signal CKE allowing an input to memory unit 4, a signal /CS identifying an input of a command, a signal /RAS indicating an input of a row command, a signal /CAS indicating an input of a column command, a signal /WE as an identification signal of read and write, a reference potential Vref determining the H level/L level of an input signal, address signals A0–A12, 3-bit bank addresses BA0–BA2 of integrated eight memory banks, and data input signals DI0–DIm, SI0–SIn. Memory unit 4 outputs data output signals DO0–DOm, SOUT0–SOUTn to logic unit 3. Herein, m is a number larger than n.

While signal /CS is activated, memory unit 4 recognizes a command at a leading edge of a clock.

Address signals A0–A12 are used to input a row address and a column address. A part of the address signals is also used for writing to a mode register 16.

Memory unit 4 includes a mode decoder 6 recognizing an input command, mode register 16 holding an operation mode, a row address latch 8 fetching a row address from an address terminal, a column address latch 12 fetching a column address from an address terminal, a bank address latch 18 fetching a bank address signal from a bank address, and a bank decoder 20 decoding the bank address output from bank address latch 18 and activating a corresponding bank.

Memory unit 4 further includes a row predecoder 10 receiving an address output from row address latch 8 and outputting a corresponding signal to a row decoder RD, a burst address counter 28 generating continuous column addresses during burst operation, and a column predecoder 14 receiving the address output from burst address counter 28 and outputting a corresponding signal to a column decoder CD.

Memory unit 4 further includes a data selection unit 50, a data conversion unit 22, a global data bus G-I/O, and memory banks BANK0–BANK7.

Data selection unit 50 selects one of a path inputting data input signals DI0–DIn and a path inputting data input signals SI0–SIn. Data selection unit 50 also selects one of a path outputting data output signals DO0–DOn and a path outputting data output signals SOUT0–SOUTn.

Data conversion unit 22 converts a data rate between data selection unit 50 and global data bus G-I/O to communicate data.

Global data bus G-I/O communicates data with eight memory banks BANK0–BANK7. As will be described below, each of memory banks BANK0–BANK7 includes a thin film magnetic element as a memory element of a memory array MA, and can hold data in a non-volatile manner.

In recent years, an MRAM device becomes a focus of attention as a memory device which can store data in a non-volatile manner with low power consumption. The MRAM device is a memory device which stores data in a non-volatile manner using a plurality of thin film magnetic elements formed in a semiconductor integrated circuit and which can randomly access to each of the thin film magnetic elements.

It is particularly shown that the performance of the MRAM device is dramatically improved by using as a memory cell a thin film magnetic element utilizing a magnetic tunnel junction (MTJ).

Figure 3:
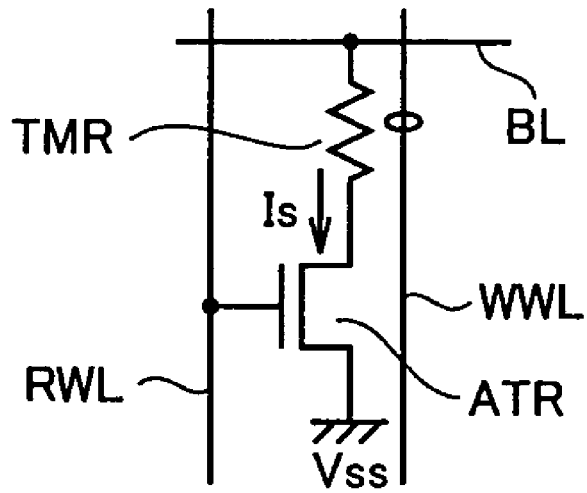
FIG. 3 is a schematic view of a structure of a memory cell having a magnetic tunnel junction portion, which is included in a memory array MA shown in FIG. 2.

FIG. 3 is a schematic view of a structure of a memory cell having a magnetic tunnel junction portion (also referred to as an "MTJ memory cell" hereafter), which is included in memory array MA shown in FIG. 2.

Referring to FIG. 3, the MTJ memory cell includes a tunneling magneto-resistance element TMR having an electric resistance which changes corresponding to a stored data level, and an access element ATR to form a path of a sense current Is which passes through tunneling magneto-resistance element TMR during data reading. Access element ATR is also referred to as an access transistor ATR hereafter because access element ATR is typically formed with a field effect transistor. Access transistor ATR is coupled between tunneling magneto-resistance element TMR and a fixed voltage (a ground voltage Vss).

For the MTJ memory cell, a write word line WWL for indicating data writing, a read word line RWL for executing data reading, and a bit line BL which is a data line for transmitting an electric signal corresponding to a data level of stored data during data reading and data writing are arranged in memory array MA.

Figure 4:
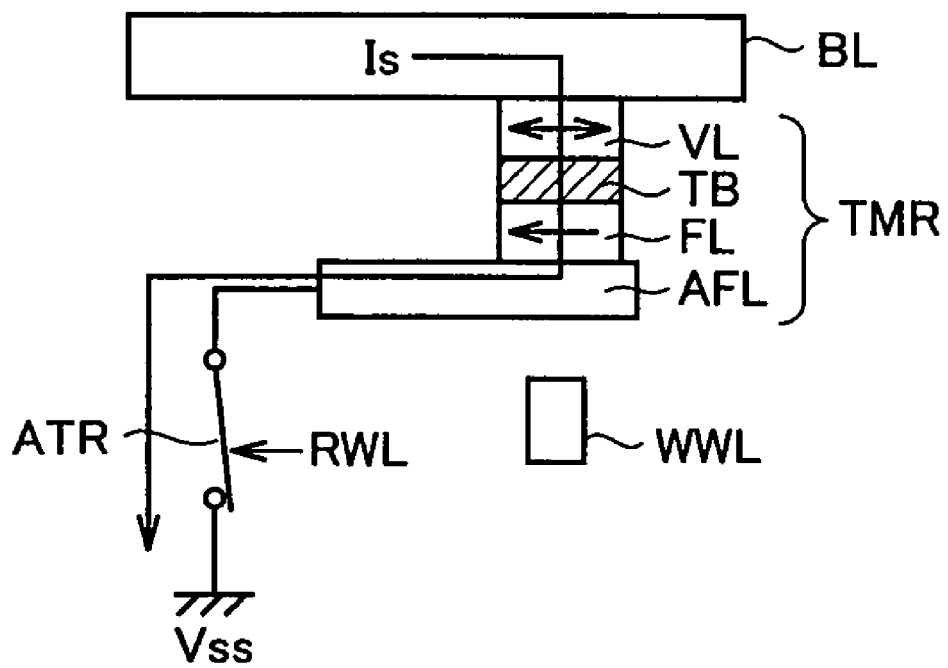
FIG. 4 is a conceptual diagram for describing a data read operation from an MTJ memory cell.

FIG. 4 is a conceptual diagram for describing a data read operation from the MTJ memory cell.

Referring to FIG. 4, tunneling magneto-resistance element TMR has a ferromagnetic material layer FL having a fixed constant direction of magnetization (also referred to as a "fixed magnetic layer" hereafter) and a ferromagnetic material layer VL magnetized in a direction corresponding to an externally applied magnetic field (also referred to as a "free magnetic layer" hereafter). A tunnel barrier (a tunnel film) TB formed with an insulator film is provided between fixed magnetic layer FL and free magnetic layer VL. Free magnetic layer VL is magnetized in a direction same as or opposite to fixed magnetic layer FL corresponding to stored data written therein. A magnetic tunnel junction is formed by fixed magnetic layer FL, tunnel barrier TB and free magnetic layer VL.

During data reading, access transistor ATR is brought into conduction in response to an activation of read word line RWL. Thus, sense current Is can flow through a current path from bit line BL through tunneling magneto-resistance element TMR and access transistor ATR to a ground node.

An electric resistance of tunneling magneto-resistance element TMR changes according to a relation between respective directions of magnetization of fixed magnetic layer FL and free magnetic layer VL. More specifically, when the directions of magnetization of fixed magnetic layer FL and free magnetic layer VL are the same, an electric resistance value of tunneling magneto-resistance element TMR will be lower than that when the directions are opposite to each other.

Therefore, a change in voltage generated by sense current Is at tunneling magneto-resistance element IMR will correspond to a stored data level if free magnetic layer VL is magnetized in a direction corresponding to the stored data. Thus, when the memory cell data is to be read, the data can be read by applying a constant voltage to the memory cell and sensing the change in sense current Is which corresponds to data held therein with a current detection-type sense amplifier. In addition, stored data of the MTJ memory cell can be read by sensing a voltage of bit line BL when, for example, bit line BL is precharged to a certain potential and sense current Is is then allowed to flow through magneto-resistance element TMR.

Figure 5:
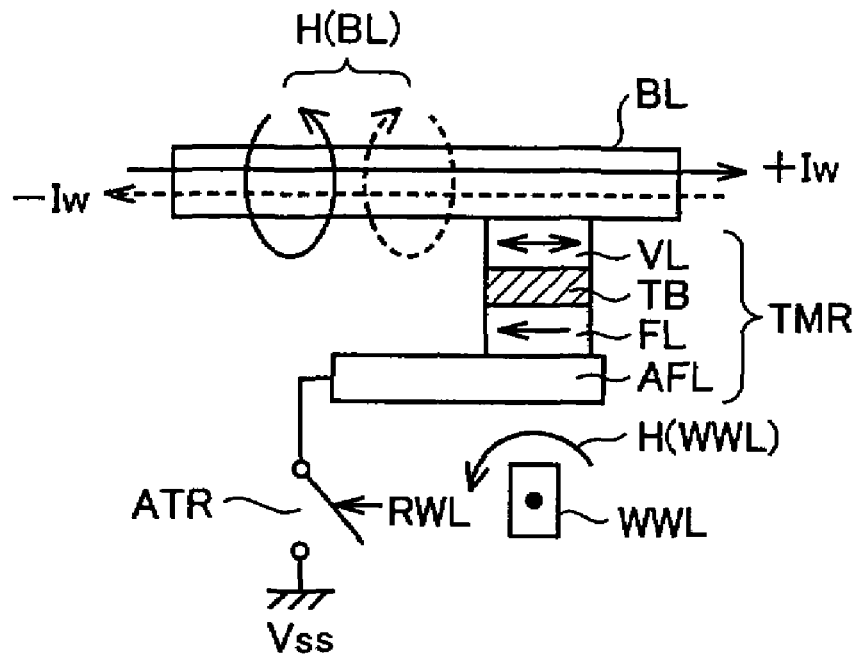
FIG. 5 is a conceptual diagram for describing a data write operation to the MTJ memory cell.

FIG. 5 is a conceptual diagram for describing a data write operation to the MTJ memory cell.

Referring to FIG. 5, during data writing, read word line RWL is deactivated and access transistor ATR is correspondingly set to a non-conductive state. In this state, a data write current to magnetize free magnetic layer VL in a direction corresponding to written data flows through respective write word line WWL and bit line BL. The direction of magnetization of free magnetic layer VL is determined corresponding to a magnetic field H(BL) generated by the data write current flowing through bit line BL.

Figure 6:
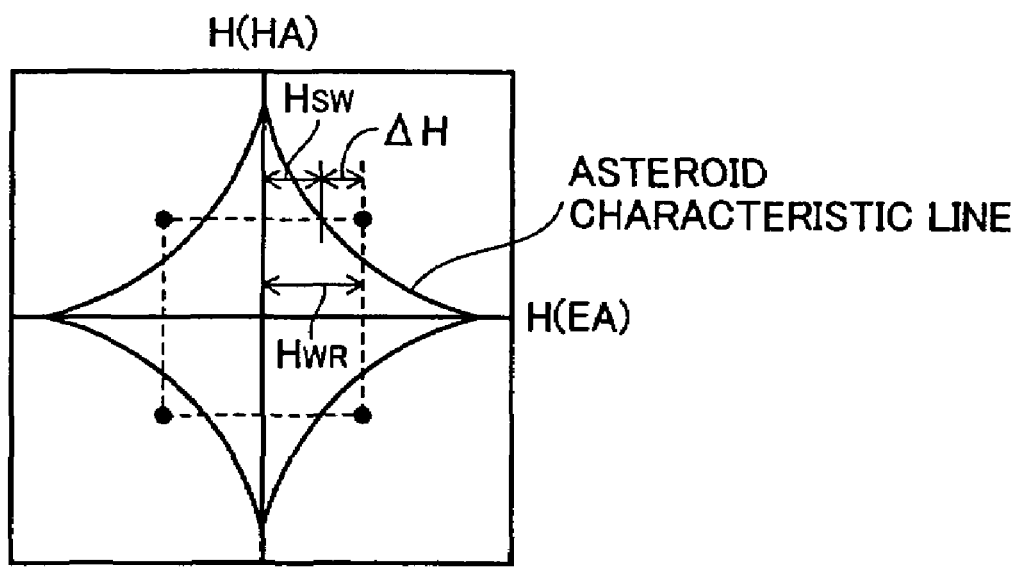
FIG. 6 is a conceptual diagram for describing a relation between a data write current and a direction of magnetization of a tunneling magneto-resistance element when data is written to the MTJ memory cell.

FIG. 6 is a conceptual diagram for describing a relation between a data write current and a direction of magnetization of a tunneling magneto-resistance element when data is written to the MTJ memory cell.

Referring to FIG. 6, a horizontal axis H(EA) indicates a magnetic field applied in a direction of an easy axis (EA) in free magnetic layer VL within tunneling magneto-resistance element TMR. A vertical axis H(HA) indicates a magnetic field affecting in a direction of a hard axis (HA) in free magnetic layer VL. Each of magnetic fields H(EA) and H(HA) correspond to one of two magnetic fields generated by currents respectively flow through bit line BL and write word line WWL.

In the MTJ memory cell, the fixed direction of magnetization of fixed magnetic layer FL is a direction along the easy axis of free magnetic layer VL, and free magnetic layer VL is magnetized in a direction same as or opposite to fixed magnetic layer FL along the direction of the easy axis corresponding to the level ("0" or "1") of the stored data. In the following specification, electric resistances of tunneling magneto-resistance element TMR respectively corresponding to the two directions of magnetization of free magnetic layer VL will be indicated as R1 and R0 (where R1>R0), respectively. The MTJ memory cell can store 1-bit data ("1" and "0") corresponding to the two directions of magnetization of free magnetic layer VL.

The direction of magnetization of free magnetic layer VL can be rewritten only when a sum of applied magnetic fields H(EA) and H(HA) reaches an outer region of an asteroid characteristic line shown in the drawing. That is, the direction of magnetization of free magnetic layer VL will not change when an applied data write magnetic field has intensity corresponding to an inner region of the asteroid characteristic line.

As shown by the asteroid characteristic line, a threshold value of a magnetic field along the easy axis which is needed to change the direction of magnetization can decrease by applying a magnetic field in a direction of the hard axis to free magnetic layer VL.

When an operating point during data writing is designed as the example shown in FIG. 6, a data write magnetic field in the direction of the easy axis in the MTJ memory cell as an object of the data writing is designed to have intensity of $H_{WR}$. That is, a value of a data write current flowing through bit line BL or write word line WWL is set so as to obtain the data write magnetic field $H_{WR}$. Data write magnetic field $H_{WR}$ is generally indicated as a sum of a switching magnetic field $H_{SW}$, which is needed to switch the direction of magnetization, and a margin $\Delta H$. That is, $H_{WR}=H_{SW}+\Delta H$.

To rewrite stored data of the MTJ memory cell, that is, the direction of magnetization of tunneling magneto-resistance element TMR, a data write current having at least a prescribed level must be applied to both of write word line WWL and bit line BL. With this, free magnetic layer VL in tunneling magneto-resistance element. TMR is magnetized in a direction same as or opposite to the direction of magnetization of fixed magnetic layer FL corresponding to a direction of a data write magnetic field along the easy axis (EA). The direction of magnetization once written to tunneling magneto-resistance element TMR, that is, the stored data of the MTJ memory cell is held in a non-volatile manner until a new data write operation is executed.

As described above, the electric resistance of tunneling magneto-resistance element TMR changes according to the direction of magnetization which can be rewritten by an applied data write magnetic field. Data can be stored in a non-volatile manner by bringing respective two directions of magnetization of free magnetic layer VL in tunneling magneto-resistance element TMR into correspondence with the levels ("1" and "0") of the stored data.

Figure 7:
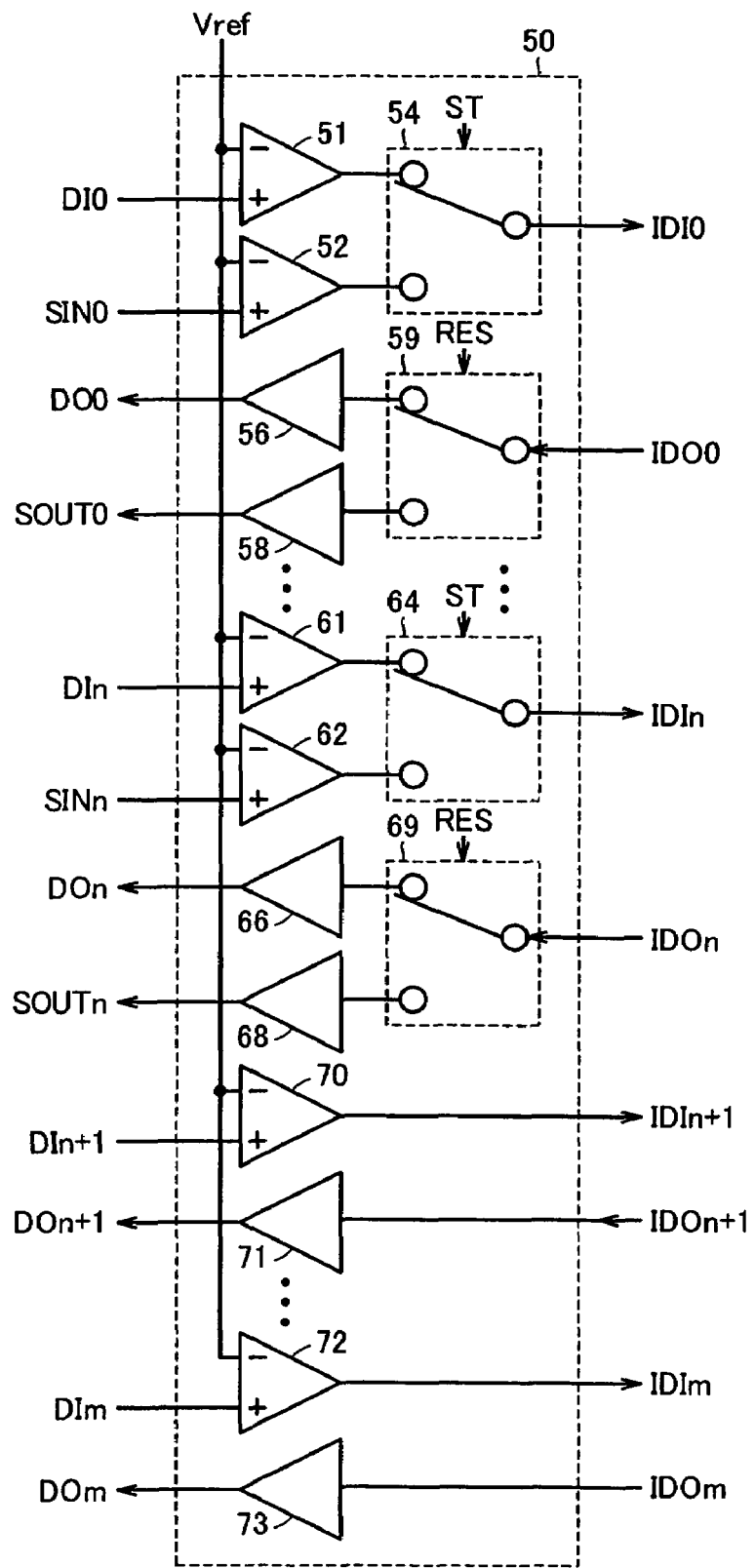
FIG. 7 is a circuit diagram of a structure of a data selection unit 50 shown in FIG. 2.

FIG. 7 is a circuit diagram of a structure of data selection unit 50 shown in FIG. 2.

Referring to FIG. 7, data selection unit 50 includes input buffer circuits 51, 52, 61, 62, output buffer circuits 56, 58, 66, 68, multiplexers 54, 64, and demultiplexers 59, 69.

Input buffer circuit 51 determines the level of signal DI0 using reference potential Vref as a threshold level and transmits the result to the inside. Input buffer circuit 52 determines the level of a signal SIN0 using reference potential Vref as a threshold level and transmits the result to the inside. Input buffer circuit 61 determines the level of signal DIn using reference potential Vref as a threshold level and transmits the result to the inside. Input buffer circuit 62 determines the level of a signal SINn using reference potential Vref as a threshold level and transmits the result to the inside.

Multiplexer 54 selects one of the outputs of input buffer circuits 51, 52 corresponding to signal ST and outputs to the inside as a signal IDI0. Multiplexer 64 selects one of the outputs of input buffer circuits 61, 62 corresponding to signal ST and outputs to the inside as a signal IDIn.

Demultiplexer 59 selectively provides a signal IDO0 provided from data conversion unit 22 shown in FIG. 2 to one of output buffer circuits 56, 58 corresponding to signal RES. Output buffer circuit 56 outputs signal DO0 to logic unit 3. Output buffer circuit 58 outputs signal SOUT0 to logic unit 3.

Demultiplexer 69 selectively provides a signal IDOn provided from data conversion unit 22 shown in FIG. 2 to one of output buffer circuits 66, 68 corresponding to signal RES. Output buffer circuit 66 outputs signal DOn to logic unit 3. Output buffer circuit 68 outputs signal SOUTn to logic unit 3.

Data selection unit 50 further includes input buffer circuits 70, 72 and output buffer circuits 71, 73. In input buffer circuits 70, 72 and output buffer circuits 71, 73 switching of data transfer paths corresponding to signal ST or RES is not performed.

Input buffer circuit 70 determines the level of a signal DIn+1 using reference potential Vref as a threshold level and outputs a signal IDIn+1 to memory unit 4. Input buffer circuit 72 determines the level of signal DIm using reference potential Vref as a threshold level and outputs a signal IDIm to memory unit 4.

Output buffer circuit 71 receives a signal IDOn+1 from memory unit 4 and outputs a signal DOn+1 to logic unit 3. Output buffer circuit 73 receives a signal IDOm from memory unit 4 and outputs signal DOm to logic unit 3.

Figure 8:
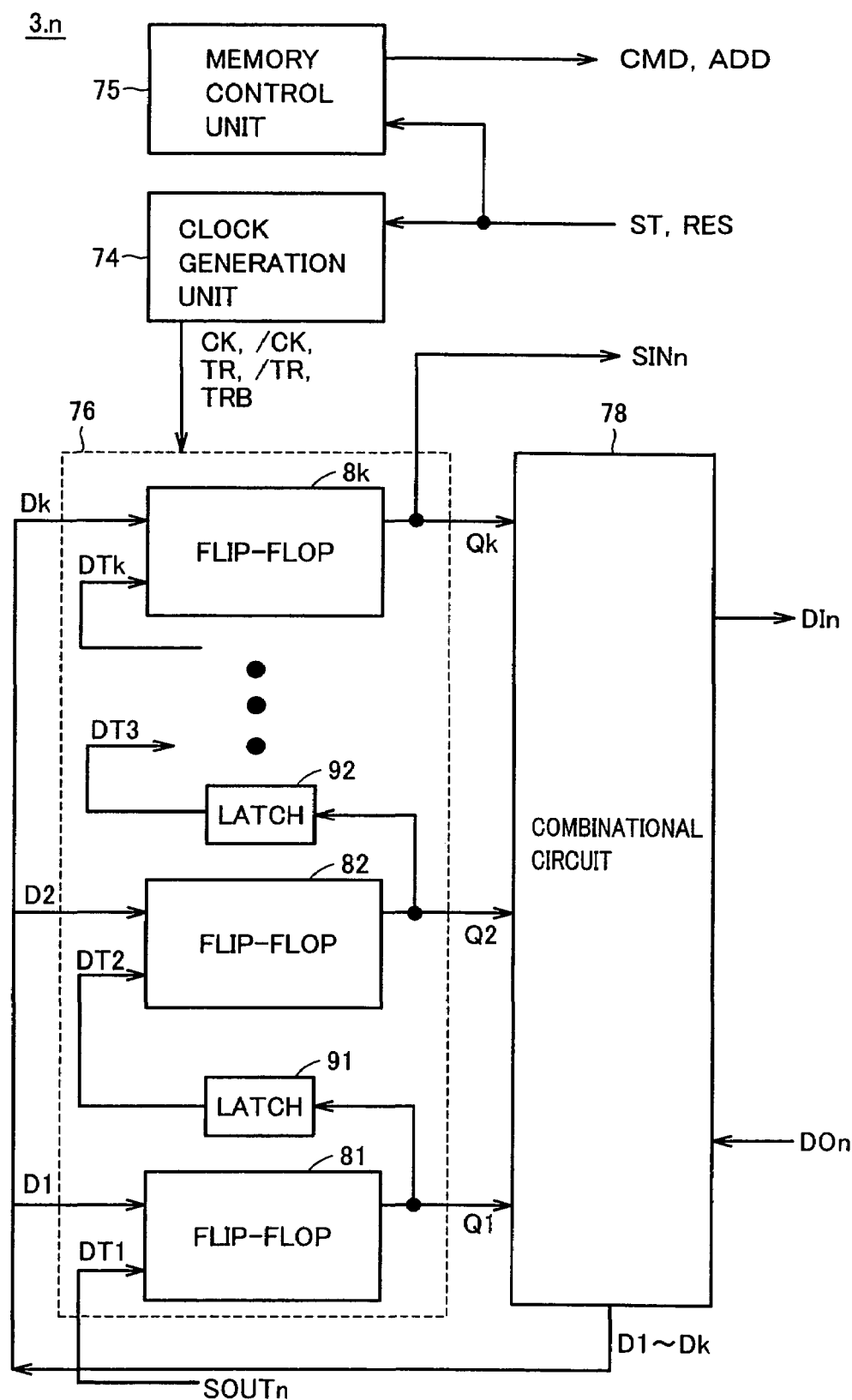
FIG. 8 is a circuit diagram of a structure of a logic circuit 3.n shown in FIG. 1.

FIG. 8 is a circuit diagram of a structure of logic circuit 3.n shown in FIG. 1.

Referring to FIG. 8, logic circuit 3.n includes a memory control unit 75 outputting command signal CMD and address signal ADD to memory unit 4 corresponding to signals ST, RES, and a clock generation unit 74 generating clock signals CK, /CK, TR, /TR, TRB corresponding to signals ST, RES.

Logic circuit 3.n includes a data hold unit 76 communicating data corresponding to an output of clock generation unit 74 and a combinational circuit 78 performing a prescribed operation corresponding to signals Q1–Qk output from data hold unit 76 and outputting signals D1–Dk.

Combinational circuit 78 is a circuit in which an output signal corresponding to a certain input signal is uniquely determined regardless of a previous state, and is formed, for example, with a combination of logic gate circuits such as an AND circuit, an NAND circuit, an NOR circuit, and an OR circuit.

Data hold unit 76 includes a flip-flop 81 receiving signal SOUTn provided from the memory unit as a signal DT1 and receiving signal D1 output from the combinational circuit as an input, a latch 91 receiving signal Q1 output from the flip-flop, a flip-flop 82 receiving a signal DT2 output from latch 91 and a signal D2 output from combinational circuit 78 and outputting a signal Q2, a latch 92 receiving signal Q2 and outputting a signal DT3, and a flip-flop 8k receiving a signal DTk and signal Dk output from combinational circuit 78 and outputting signal Qk. Signal Qk output from flip-flop 8k is provided to combinational circuit 78, and is also provided to memory unit 4 as signal SINn.

During a normal operation, data DOn read from memory unit 4 is provided to combinational circuit 78, and after prescribed processing is performed, a result of the processing is temporarily held in flip-flops 81–8k as signals D1–Dn. The data held in flip-flops 81–8k is input to combinational circuit 78 as signals Q1–Qk, and after prescribed processing is performed, a result of the processing is output to memory unit 4 as signal DIn.

When power control 2 activates control signal ST, flip-flops 81–8k are connected in series. The content held in flip-flops 81–8k temporarily holding the result of previous processing is successively shifted and sent to memory unit 4 as signal SINn via a path different from that in a normal operation.

In addition, when power control 2 activates control signal RES, flip-flops 81–8k are connected in series. The result of previous processing saved in memory unit 4 is read from memory unit 4 as signal SOUTn and is successively read into flip-flops 81–8k. Thus, data is read from memory unit 4 to logic circuit 3.n via a path different from that in a normal operation. Logic circuit 3.n can perform subsequent processing using the previous processing result.

Figure 9:
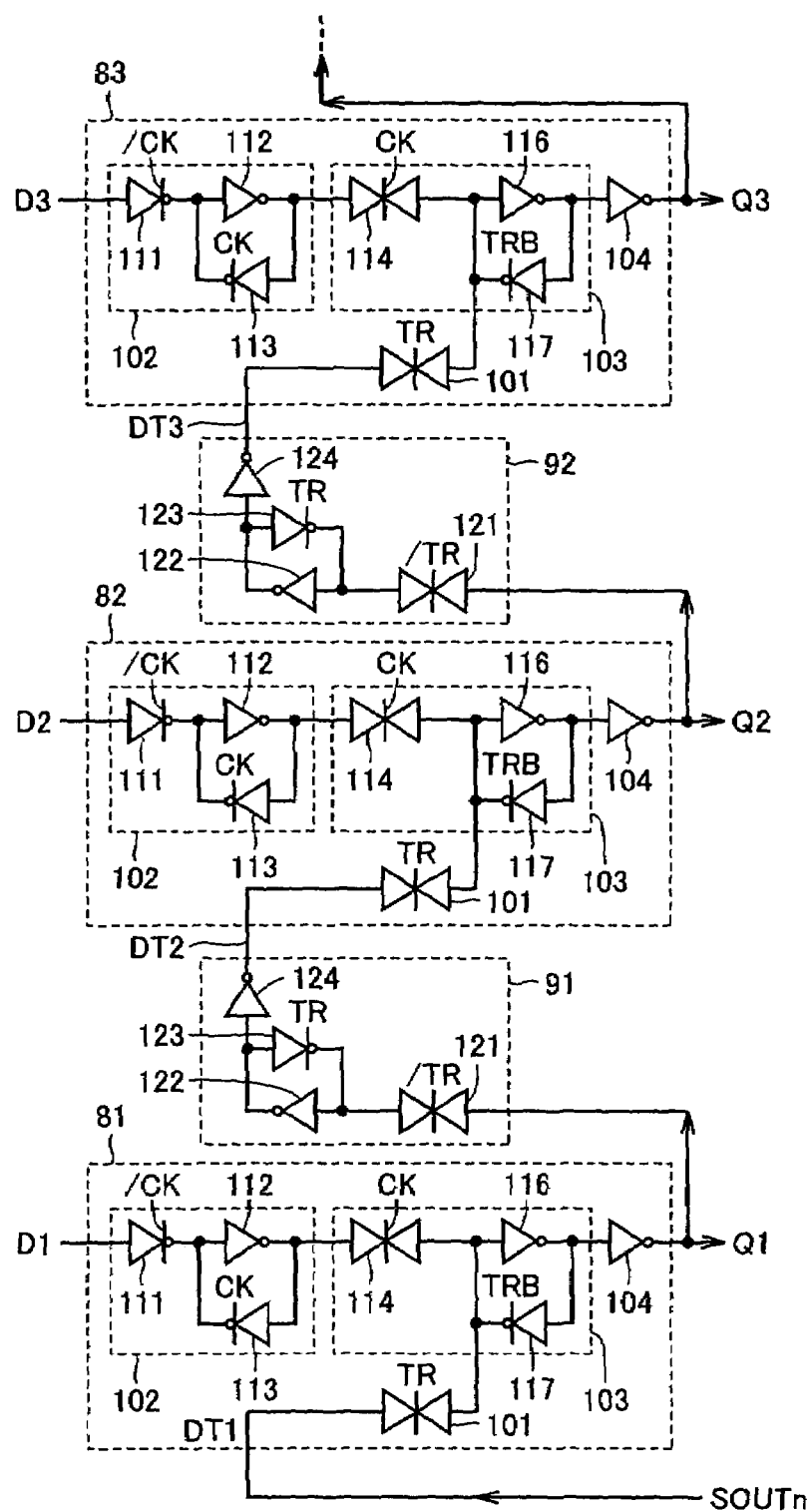
FIG. 9 is a circuit diagram of a more detailed structure of a data hold unit 76.

FIG. 9 is a circuit diagram of a more detailed structure of data hold unit 76.

Referring to FIG. 9, data hold unit 76 includes flip-flops 81-83 and latches 91, 92.

Flip-flop 81 includes a transmission gate 101 which is brought into conduction in response to transfer clock signal TR, a master latch 102 and a slave latch 103.

Master latch 102 includes a clocked inverter 111 which is activated when clock signal /CK is at the H level to receive and invert signal D1, an inverter 112 receiving and inverting an output of clocked inverter 111, and a clocked inverter 113 which is activated when clock signal CK is at the H level to receive and invert an output of inverter 112 and feed the result back to an input node of inverter 112.

Slave latch 103 includes a transmission gate 114 which is brought into conduction when clock signal CK is at the H level, an inverter 116, and a clocked inverter 117 which is activated when clock signal TRB is at the H level.

Transmission gate 114 is connected between an output of inverter 112 and an input of inverter 116. An output of inverter 116 is fed back to the input of inverter 116 by clocked inverter 117. Transmission gate 101 is connected between a node receiving signal SOUTn provided from memory unit 4 and an input node of inverter 116.

Flip-flop 81 further includes an inverter 104 which receives and inverts the output of inverter 116 and outputs signal Q1.

Latch 91 includes a transmission gate 121, inverters 122, 124 and a clocked inverter 123. Transmission gate 121 is provided between an output of inverter 104 and an input of inverter 122. Transmission gate 121 is brought into conduction when clock signal /TR is at the H level. Clocked inverter 123 is activated when transfer clock signal TR is at the H level, and feeds an output of inverter 122 back to the input of inverter 122. Inverter 124 receives and inverts the output of inverter 122 and outputs signal DT2, which signal DT2 is provided to flip-flop 82.

Structures of flip-flops 82, 83 are similar to that of flip-flop 81. Thus, corresponding elements are indicated by the same characters and the descriptions thereof will not be repeated.

In addition, latch 92 has a structure similar to that of latch 91, and corresponding elements are indicated by the same characters and the descriptions thereof will not be repeated.

Each of flip-flops 81, 82, 83 is formed by connecting two latches, that is, master latch 102 and slave latch 103. Normally, signals input to these two latches are controlled according to complementary clocks CK, /CK, and perform an operation of shifting data by one clock and transferring the result from inputs D1, D2, D3 to respective outputs Q1, Q2, Q3. When clock signals CK, /CK stop, data of that time is held in the latches.

When serial transfer of the held data is performed as the power is turned off or turned on, the transfer operation is performed utilizing other transfer clocks TR, /TR while stopping clock signals CK, /CK for normal operation. In this situation, each flip-flop is connected in series to enable successive transfer of the data latched in each flip-flop.

Therefore, when the data latched in logic unit 3 is transferred to memory unit 4 as the power is turned off, the data is successively transferred to memory unit 4 from the data held in a flip-flop at a front portion in the serial connection. On the contrary, when the data is transferred from memory unit 4 to logic unit 3 as the power is reset, the data from memory unit 4 is successively input to a flip-flop at a back portion in the serial connection, and is successively transferred to flip-flops connected in series.

Though the flip-flop is described herein as an example of an element holding data in a system LSI, it is not limited thereto, and all nodes holding data in the system LSI can be objects of the transfer.

Data in a volatile memory array such as memory cell data of a SRAM or memory cell data of a DRAM array, for example, can similarly be transferred to the MRAM. Other non-volatile memory such as the flash EEPROM, which has low data writing rate, also temporarily stores data in the MRAM in a situation such as an instantaneous power failure which does not allow enough time to write data. The temporarily stored data may be rewritten to the flash EEPROM at a certain time after the power is reset.

As described above, the data can be saved without interrupting a normal operation because a transfer path for transferring data when the power is turned off is provided separately from a normal data transfer path. In addition, the number of wires for the transfer path is decreased by connecting flip-flops of logic unit 3 in series, and an area penalty is thus decreased. Further, a flip-flop in any location can use this path for the transfer.

Figure 10:
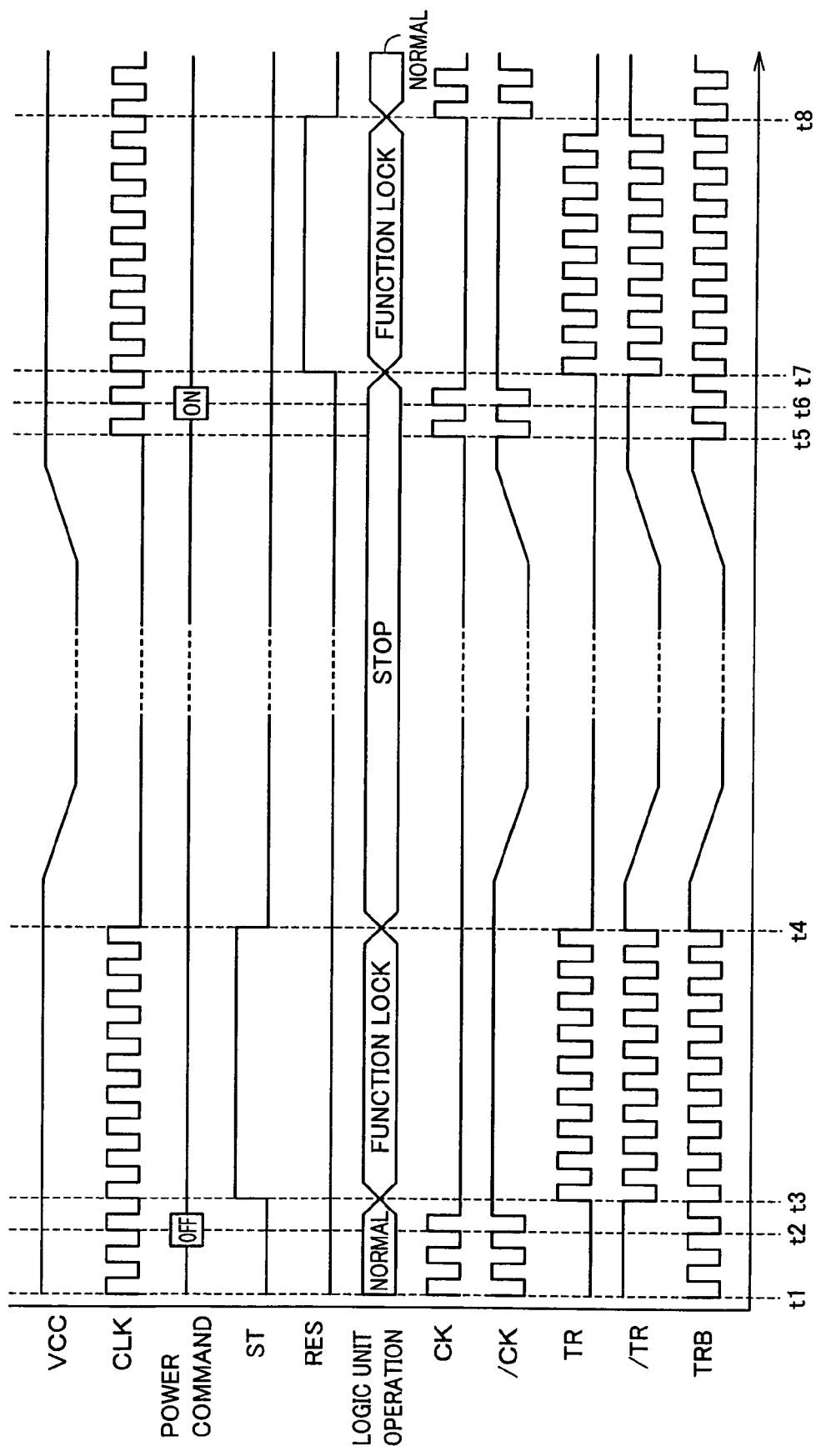
FIG. 10 is an operation waveform diagram for describing a data transfer operation of semiconductor device 1 of the first embodiment.

FIG. 10 is an operation waveform diagram for describing a data transfer operation of semiconductor device 1 of the first embodiment.

Referring to FIGS. 2 and 10, in a normal operation during a time period t1–t2, logic unit 3 and memory unit 4 arranged in the system LSI communicate signals such as address, command and data using a prescribed port of memory unit 4 as an interface. Memory banks BANK0–BANK7 and data conversion unit 22 performing serial-parallel conversion and parallel-serial-conversion of data are connected via global data bus G-I/O. Data selection unit 50 is arranged between the data conversion unit and an input-output port of memory unit 4. During a normal operation, the data selection unit communicates data with logic unit 3 on paths transmitting signals DI0–DIn, DO0–DOn.

A power-off command, which is a notice of shutting off the power of the system LSI, is input from the outside at time t2. A situation is also contemplated in which the power-off command is issued by the system LSI itself by a prescribed timer operation. Power control unit 2 activates signal ST in response to this power-off command. This signal ST is for saving data under processing by a prescribed logic circuit in the logic unit. Thus, the corresponding logic circuit is set to a function lock state in response to this. In the function lock state, clock signals CK, /CK stop and the data within the flip-flop of the logic circuit maintains the state of being held in the latch within the flip-flop.

To perform a serial transfer of the flip-flop, clock signals TR, /TR for the transfer are then generated by dock generation unit 74 shown in FIG. 8.

In a time period t3–t4, the data is serially output from the corresponding logic circuit, and the data is provided to memory unit 4 as signals SIN0–SINn. Command CMD and address signal ADD needed to write this data are generated in memory control unit 72 shown in FIG. 8.

An empty address space of a memory block within memory unit 4 is assigned as an address. The empty space may be set, for example, by providing a flag indicating whether the data must be held or not when the power is turned off corresponding to each memory block, and successively writing to the block having the flag signal which is not activated.

After the transfer of data of logic unit 3 to memory unit 4 is completed, the power is turned off at time t4 and the system LSI stops the operation.

A situation in which the power is reset will now be described.

After the power is reset, inputting of the clock signal is resumed at a time t5, and a power-on command is issued at a time t6. A restoring operation is started in response to this command. Power control unit 2 activates signal RES in response to the power-on command. At this time point, settings of the flip-flop of the logic unit and data selection unit 50 of the memory unit are maintaining the serial transfer state because the function lock is still not released.

During a time period t7–t8, transfer clock TR is generated to perform the serial transfer, and the data written in the empty space within the MRAM is read and restored in the flip-flop of logic unit 3. After the data is held in the latch in the flip-flop as the original state, signal RES is deactivated at time t8 and the function lock is released to start normal processing of the logic unit.

As described above, information will not be lost even when power supply voltage VCC of the semiconductor device is completely shut off in the standby state by integrating the MRAM as memory unit 4. In addition, many data hold nodes in the logic unit can easily be accessed by performing the serial transfer using a path different from a normal path for transferring. Herein, power supply potential VCC may be set to a voltage other than 0 V, which voltage is lower than that in operation for reducing power consumption.

[Second Embodiment]

A system LSI is formed with a plurality of circuit blocks, and a degree of integration thereof is increasing in recent years as a transistor becomes smaller. On the other hand, a decrease in a transistor threshold voltage due to a decrease in an operation voltage causes an increased leak current of the transistor. In addition, as a gate oxide film of the transistor becomes thinner, a leak current of the gate oxide film increases. Furthermore, a parasitic PN diode is formed between a source/drain and a substrate of the transistor. A reverse bias is usually applied to the PN diode. As the size thereof is reduced, a concentration of an impurity of the source/drain of the transistor increases, and a leak current of the PN diode at the application of reverse bias increases.

The three problems of the leak current described above result in an increased current during standby for the whole system LSI. In a second embodiment; another structure to decrease the current of the system LSI during standby will be described.

A technique has been examined in which, in a plurality of circuit blocks in the system LSI, a power is activated only for a circuit block to be operated and a power for a circuit block in a standby state is turned off. When the power is deactivated, however, potential information of each node in the circuit block is simultaneously lost. There is an attempt to prevent this, in which a non-volatile memory cell having a floating gate, for example, is added to a node such as a latch in the circuit to prevent the information from being lost even when the power is deactivated. Such a non-volatile memory, however, is not effective because it takes a long time to program latch information.

To save and restore data in high speed is also needed from the point of view of a power control of a circuit block, because allowable lengths for transition times to transit from power-on to power-off states and from power-off to power-on states are short. In the second embodiment, a tunneling magneto-resistance element used in the MRAM and the like is used as a non-volatile memory element. The tunneling magneto-resistance element is characterized in that, it can be programmed within 1 ns, and high-speed writing thereto is possible.

Figure 11:
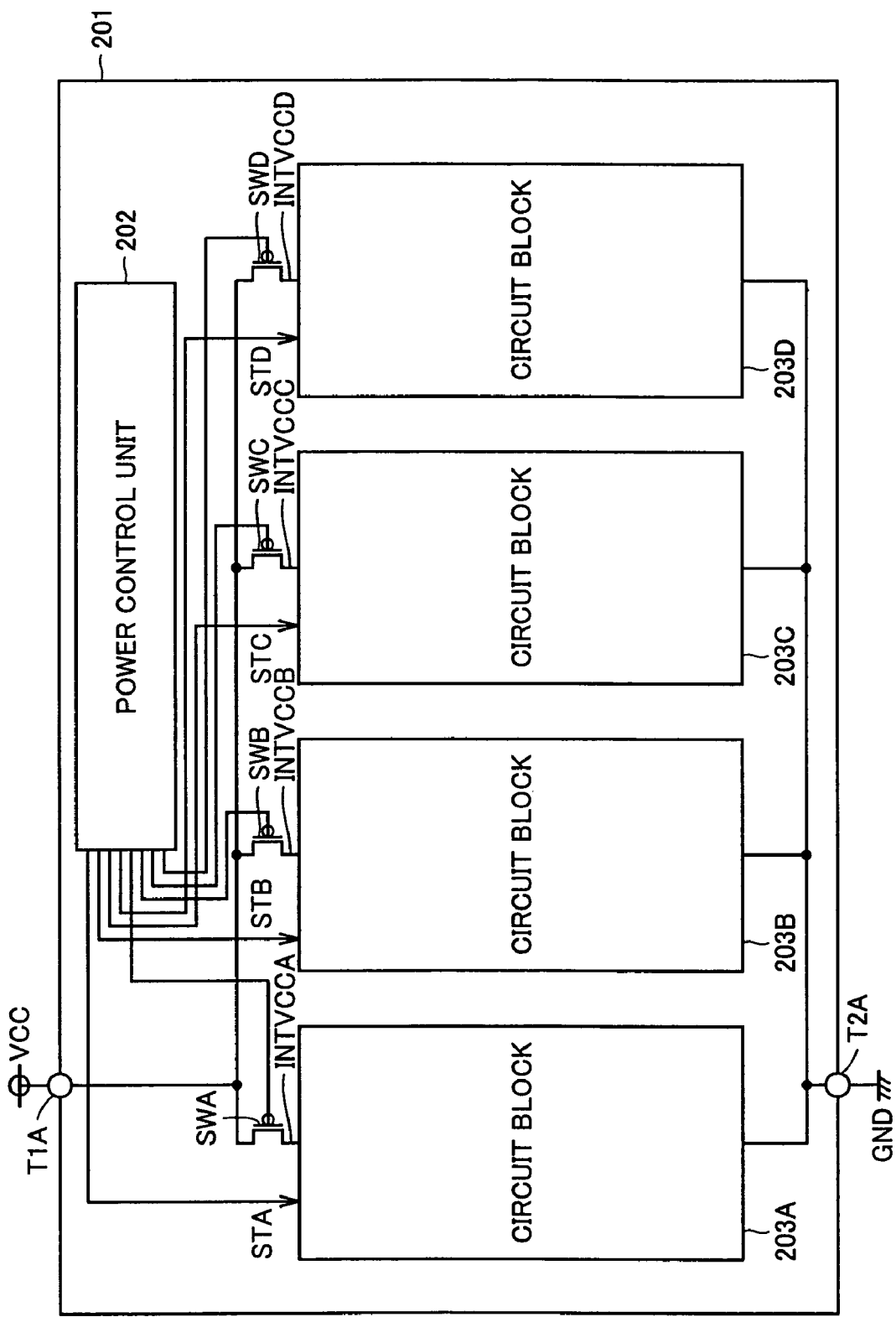
FIG. 11 is a block diagram of a structure of a semiconductor device 201 according to a second embodiment.

FIG. 11 is a block diagram of a structure of a semiconductor device 201 according to the second embodiment.

Referring to FIG. 11, semiconductor device 201 includes terminals T1A, T2A respectively receiving power supply potential VCC and ground potential GND from the outside, switch circuits SWA–SWD and circuit blocks 203A–203D. Semiconductor device 201 is a system LSI including a large-scale logic circuit as circuit blocks 203A–203D.

Switch circuit SWA is connected between terminal T1A and circuit block 203A. Switch circuit SWB is connected between terminal T1A and circuit block 203B. Switch circuit SWC is connected between terminal T1A and circuit block 203C. Switch circuit SWD is connected between terminal T1A and circuit block 203D.

Semiconductor device 201 further includes a power control unit 202 which controls conduction of switch circuits SWA–SWD and provides control signals STA–STD to respective circuit blocks 203A–203D.

Figure 12:
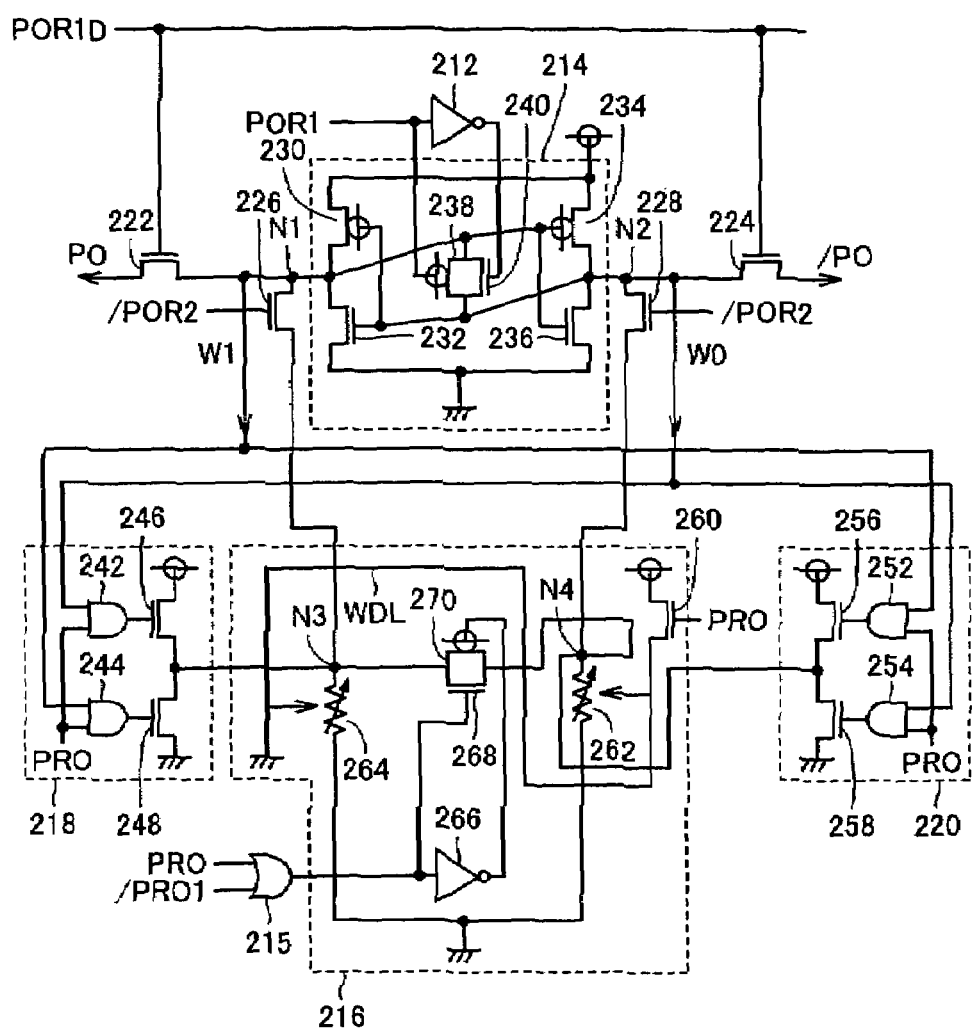
FIG. 12 is a circuit diagram of a structure of a data holding circuit 210 included in circuit blocks 203A–203D shown in FIG. 11.

FIG. 12 is a circuit diagram of a structure of a data holding circuit 210 included in circuit blocks 203A–203D shown in FIG. 11.

Referring to FIG. 12, data holding circuit 210 includes an inverter 212, a latch circuit 214, an OR circuit 215, a memory cell 216, current driver circuits 218, 220, and N channel MOS transistors 222, 224, 226, 228.

Inverter 212 receives and inverts a signal POR1. OR circuit 215 receives signals PRO and /POR1. Latch circuit 214 holds complementary data in nodes N1 and N2. N channel MOS transistor 222 is brought into conduction in response to a signal POR1D and outputs a potential of node N1 as a signal PO. Signal POR1D is a delayed signal of signal POR. N channel MOS transistor 224 is brought into conduction in response to signal POR1D and outputs a potential of node N2 as a signal /PO.

N channel MOS transistor 226 is connected between nodes N1 and N3 and receives a signal /POR2 at the gate thereof N channel MOS transistor 228 is connected between nodes N2 and N4 and receives signal /POR2 at the gate thereof.

Latch circuit 214 includes a P channel MOS transistor 230 connected between a power supply node and node N1 and having a gate connected to node N2, an N channel MOS transistor 232 connected between node N1 and a ground node and having a gate connected to node N2, a P channel MOS transistor 234 connected between the power supply node and node N2 and having a gate connected to node N1, an N channel MOS transistor 236 connected between node N2 and the ground node and having a gate connected to node N1, a P channel MOS transistor 238 connected between nodes N1 and N2 and receiving signal POR1 at the gate thereof, and an N channel MOS transistor 240 connected between nodes N1 and N2 and receiving an output of inverter 212 at the gate thereof.

A potential of node N1 is provided to current driver circuits 218, 220 as a signal W1. A potential of node N2 is provided to current driver circuits 218, 220 as a signal W0.

Current driver circuit 218 includes an AND circuit 242 receiving signals W0 and PRO, an AND circuit 244 receiving signals W1 and PRO, an N channel MOS transistor 246 connected between the power supply node and node N3 and receiving an output of AND circuit 242 at the gate thereof, and an N channel MOS transistor 248 connected between node N3 and the ground node and receiving an output of AND circuit 244 at the gate thereof.

Current driver circuit 220 includes an AND circuit 252 receiving signals W1 and POR, an AND circuit 254 receiving signals W0 and PRO, an N channel MOS transistor 256 connected between the power supply node and node N4 and receiving an output of AND circuit 252 at the gate thereof, and an N channel MOS transistor 258 connected between node N4 and the ground node and receiving an output of AND circuit 254 at the gate thereof Memory cell 216 includes an inverter 266 receiving and inverting an output of OR circuit 215, an N channel MOS transistor 268 connected between nodes N3 and N4 and receiving an output of OR circuit 215 at the gate thereof, and a P channel MOS transistor 270 connected between nodes N3 and N4 and receiving an output of inverter 266 at the gate thereof.

Memory cell 216 includes a tunneling magneto-resistance element 264 connected between node N3 and the ground node, a tunneling magneto-resistance element 262 connected between node N4 and the ground node, a write digit line WDL for generating a magnetic field for writing in tunneling magneto-resistance elements 262, 264, and an N channel MOS transistor 260 which brings one end of write digit line WDL into conduction in response to signal PRO and connects it to the power supply node. The other end of write digit line WDL is connected to the ground node.

In the second embodiment, tunneling magneto-resistance elements 262, 264 used in the MRAM are added to the data hold nodes in data holding circuit 210 such as a latch unit used in a flip-flop. When a transmission gate formed with transistors 268, 270 is brought into conduction, a path connecting nodes N3 and N4 is formed, and the path acts as bit line BL shown in FIG. 5 in a write operation.

With this, latch data can be written to the tunneling magneto-resistance element with a simple operation when the power is turned off.

In addition, the latch data can automatically be restored when the power is reset by separating nodes N3 and N4 and connecting nodes N3, N4 to respective nodes N1, N2 of the latch circuit. As compared to the first embodiment, controls during a power-off time and a power reset time are simplified, and lengths of times are substantially reduced.

Figure 13:
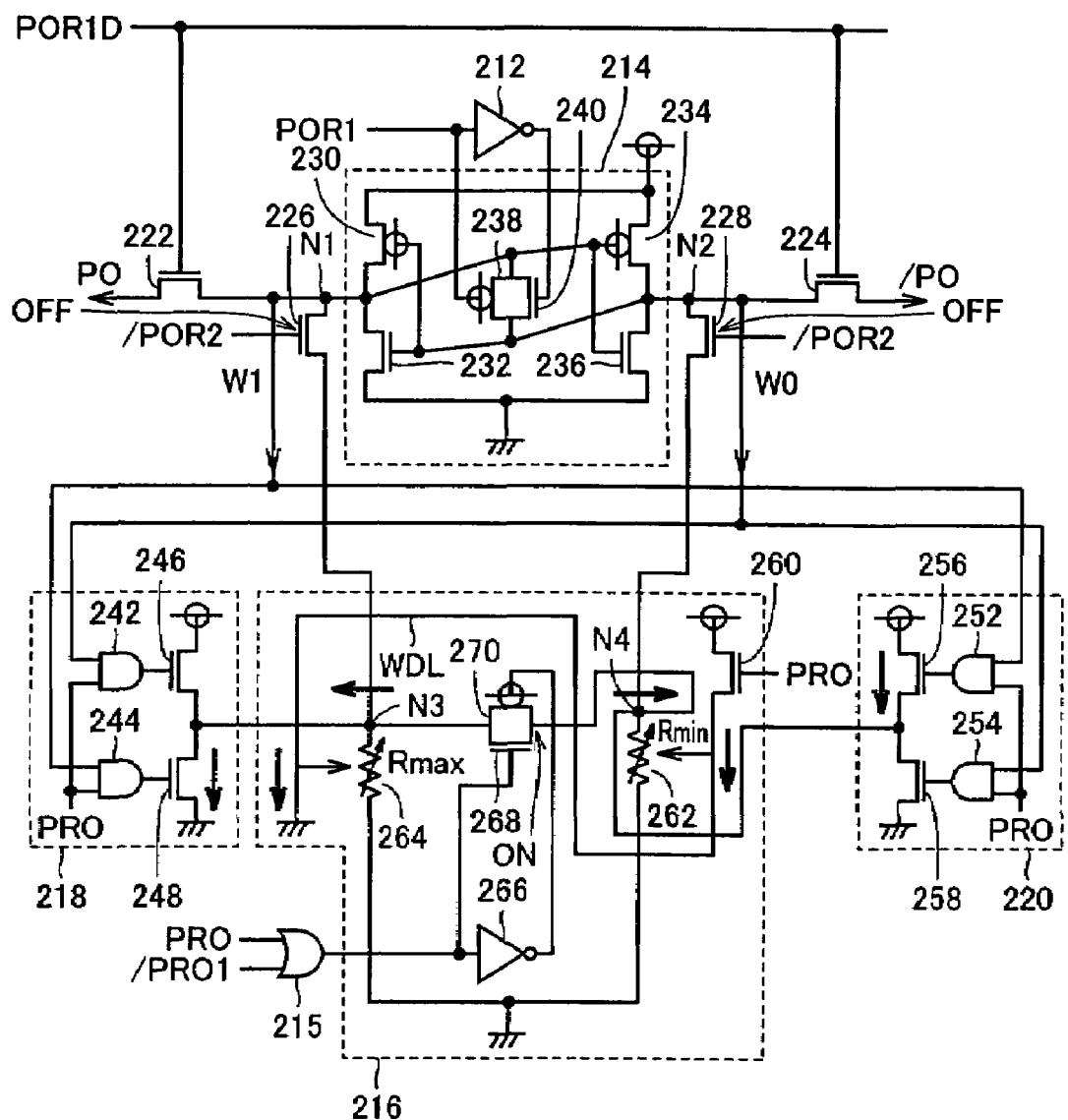
FIG. 13 is a diagram for describing an operation of writing data "1" into a tunneling magneto-resistance element of data holding circuit 210.

FIG. 13 is a diagram for describing an operation of writing data "1" into the tunneling magneto-resistance element of data holding circuit 210.

Figure 14:
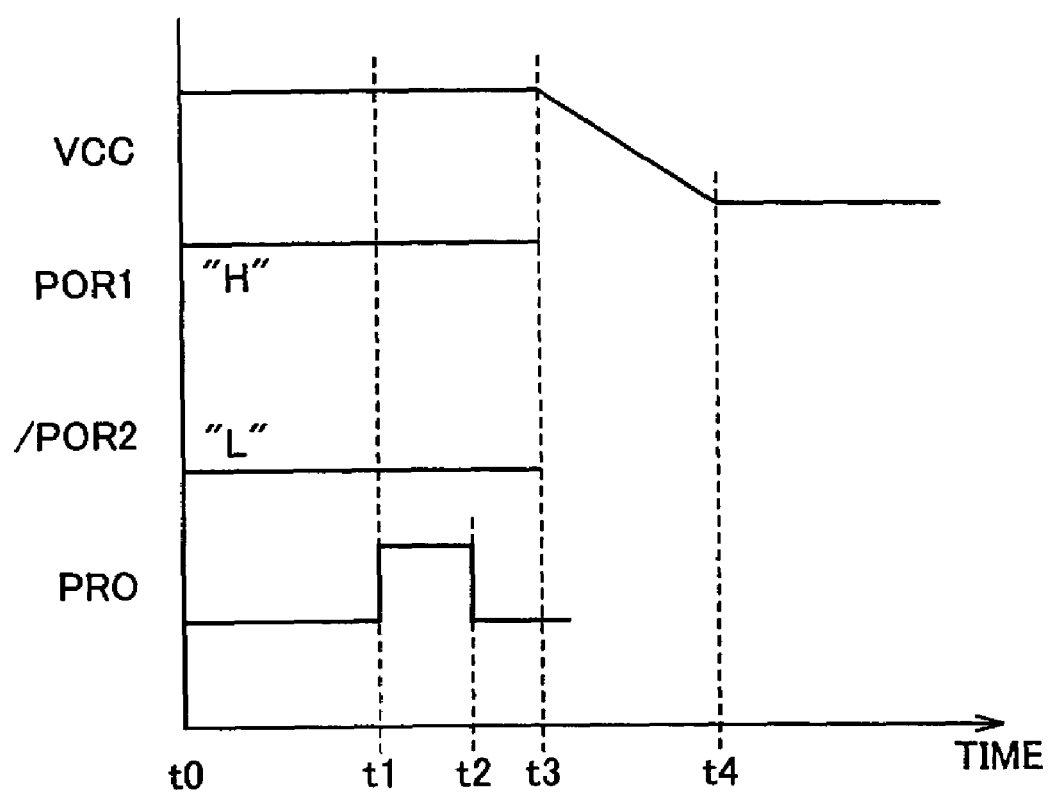
FIG. 14 is an operation waveform diagram for describing a data write operation.

FIG. 14 is an operation waveform diagram for describing a data write operation.

Referring to FIGS. 13 and 14, latch circuit 214 is performing a normal latch operation during a time period t0–t1 and communicating signals PO, /PO with other circuits via transistors 222, 224. In this state, signal POR1 is at the H level and signal /POR2 is at the L level. As a result, transistors 226, 228 are set to the off-state, and transistors 238, 240 are also set to the off-state.

Therefore, in latch circuit 214, transistors 230, 232 operate as one inverter, and transistors 234, 236 operate as one inverter. Latch circuit 214 operates as a normal latch circuit formed by cross-coupling these two inverters, and nodes N1, N2, which are outputs thereof, are connected with other circuits by transistors 222, 224.

Herein, potentials of nodes N1, N2 are always provided to current driver circuits 218, 220 as signals W1, W0.

At time t1, before entering a standby mode, write control signal PRO for saving the held data of latch circuit 214 is activated. Transistors 268, 270 are brought into conduction in response to this. When the held value of node N1 of latch circuit 214 is at the H level and that of node N2 is at the L level, for example, signal W1 is set to the H level and data "1" is written to memory cell 216. In this situation, both outputs of AND circuits 244, 252 are set to the H level because write signal PRO is at the H level. Then, N channel MOS transistors 248, 256 are brought into conduction, and a current path is formed from the power supply node to the ground node.

This current path is formed with transistors 256, 268, 270, 248. At the same time, N channel MOS transistor 260 is brought into conduction, and a current passes through write digit line WDL. Then, a free magnetic layer is magnetized, and a resistance value of tunneling magneto-resistance element 262 becomes Rmin, while a resistance value of tunneling magneto-resistance element 264 becomes Rmax. With setting the resistance values of the two tunneling magneto-resistance elements as such, the write operation of data "1" to memory cell 216 is completed.

After the write operation to the tunneling magneto-resistance element is completed, write signal PRO is deactivated at time t2. Power supply potential VCC then falls during a time period t3–t4, and the system LSI will be in the standby mode after time t4.

During the standby mode, power supply potential VCC is set to the off-state, and undesired currents such as a leak current between a source and a drain flowing through a transistor, a gate leak current flowing through a gate oxide film and a junction leak current flowing between a source/drain and a substrate are removed from current consumption.

Figure 15:
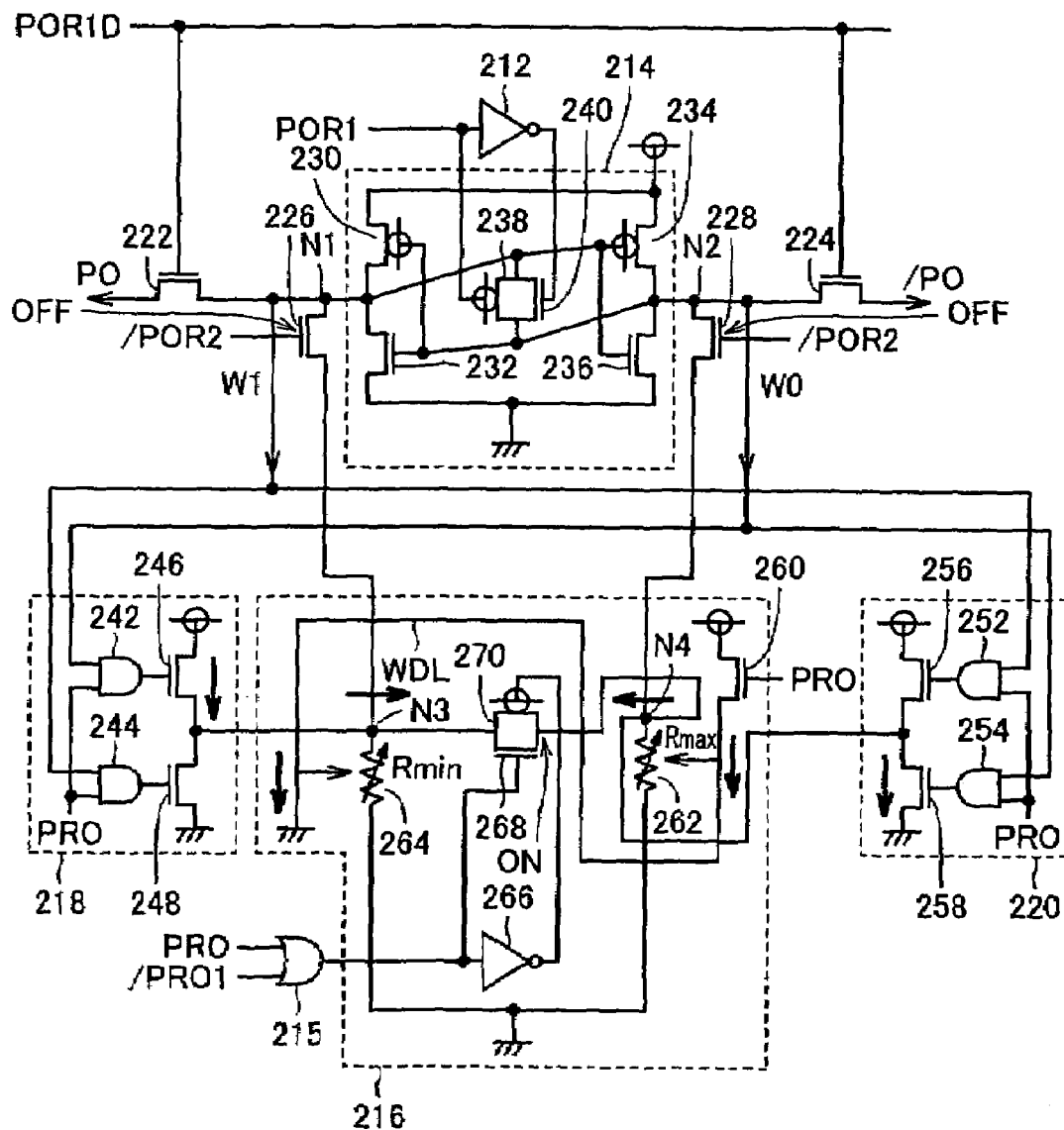
FIG. 15 shows a situation wherein data "0" is written into a memory cell 216.

FIG. 15 shows a situation wherein data "0" is written into memory cell 216.

Referring to FIG. 15, a situation is shown in which the write operation is performed when node N2 of latch circuit 214 is at the H level and node N1 is at the L level. In this situation, control signal W0 is set to the H level, and control signal W1 is set to the L level.

When write signal PRO is activated, outputs of AND circuits 242, 254 are set to the H level and N channel MOS transistors 246, 258 are brought into conduction. As transistors 268, 270 are also brought into conduction in response to write control signal PRO, a current flows from node N3 to node N4. As a current also flows through write digit line WDL in response to write control signal PRO, the free magnetic layer is magnetized, and a resistance value of tunneling magneto-resistance element 264 becomes Rmin, while a resistance value of tunneling magneto-resistance element 262 becomes Rmax. The write operation of data "0" is then ended.

Figure 16:
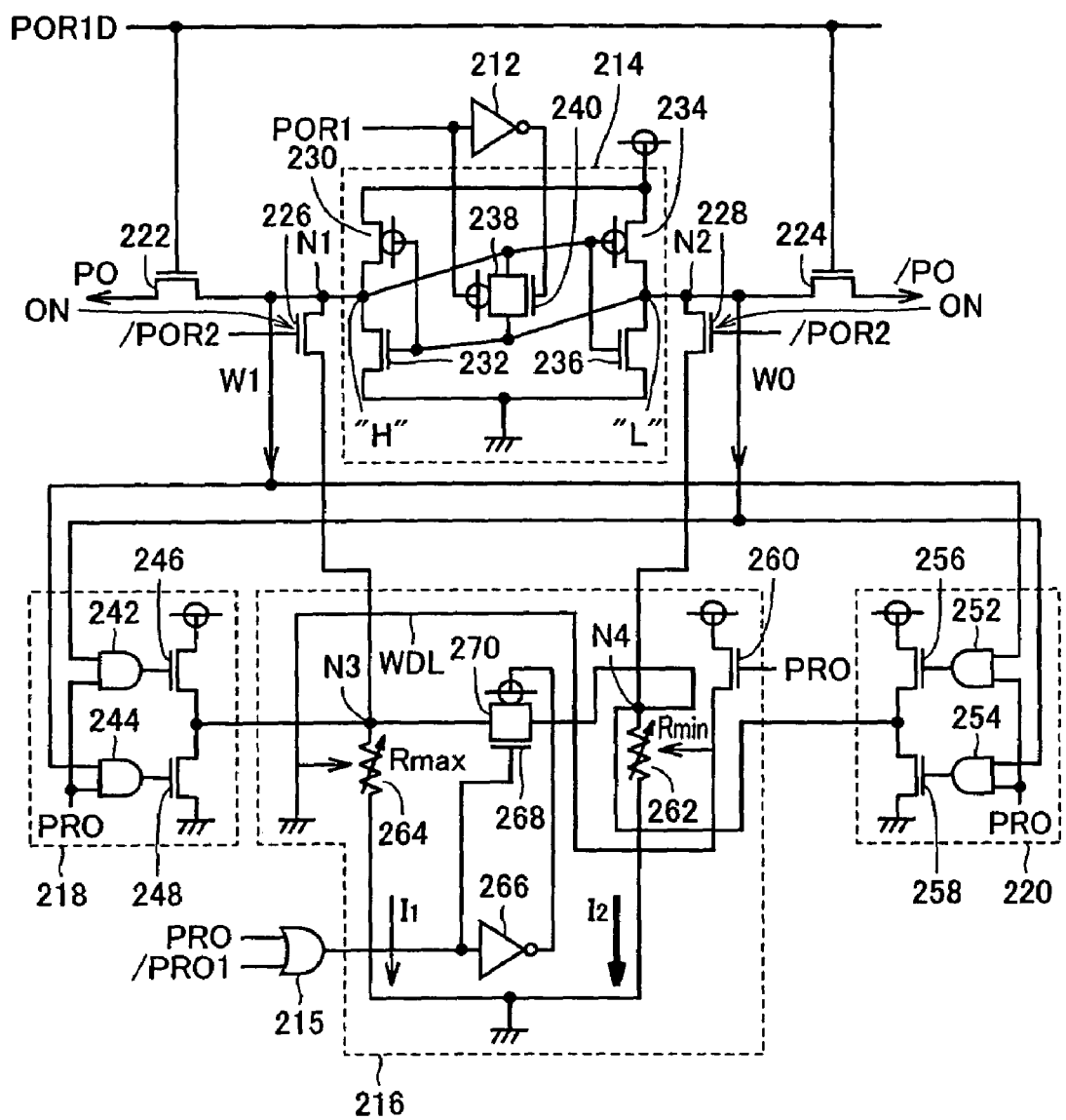
FIG. 16 shows a situation wherein data "1" is read from memory cell 216 of data holding circuit 210.

FIG. 16 shows a situation wherein data "1" is read from memory cell 216 of data holding circuit 210.

Figure 17:
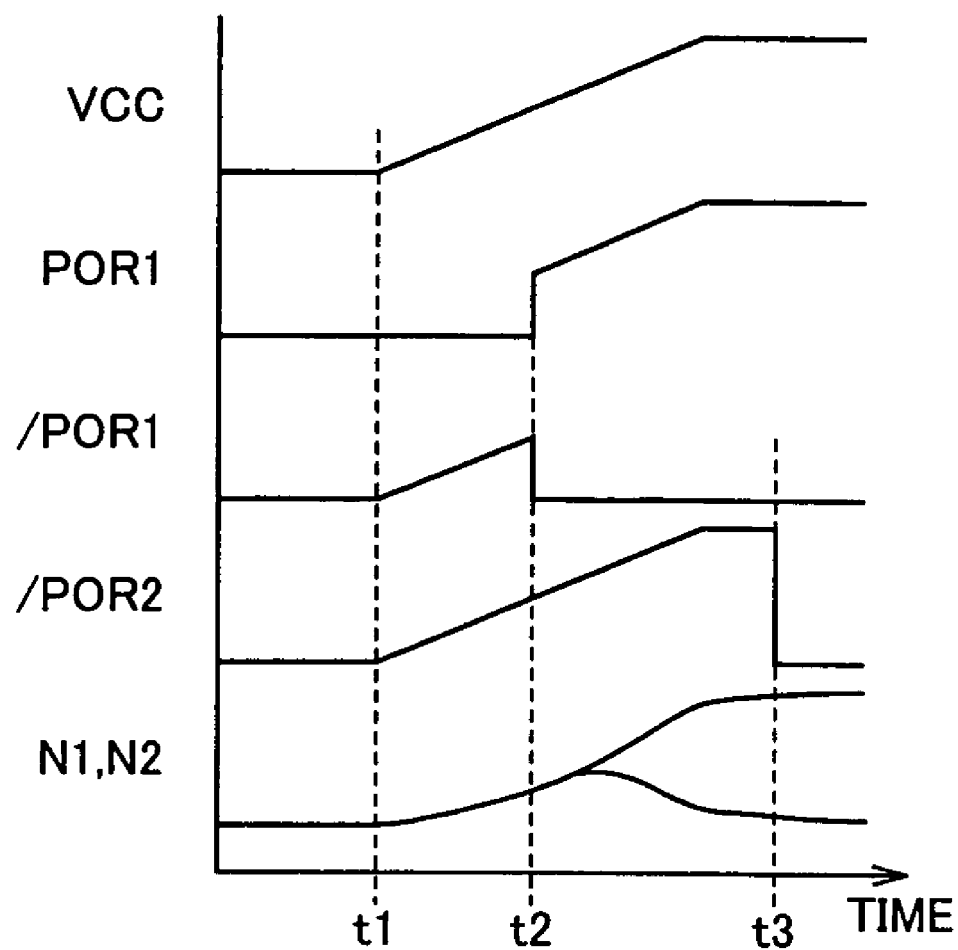
FIG. 17 is an operation waveform diagram for describing a data read operation from memory cell 216.

FIG. 17 is an operation waveform diagram for describing a data read operation from memory cell 216.

With reference to FIGS. 16, 17, a situation will be described in which data "1" is previously written to memory cell 216, and the resistance value of tunneling magneto-resistance element 264 is set to Rmax while that of tunneling magneto-resistance element 262 is set to Rmin.

First, rising of power supply potential VCC is started at time t1. During a time period t1–t2, signal POR1 is at the L level and signals /POR1, /POR2 are at the H level. In the time period t1–t2, transistors 226, 228 are set to a conductive state, and transistors 238, 240 are also set to a conductive state.

Initially, a power supply potential of latch circuit 214 increases as power supply potential VCC is activated. Potential difference between complementary nodes N1 and N2 is not generated, however, because nodes N1 and N2 are short-circuited by transistors 238, 240.

When signal POR1 changes from the L level to the H level at time t2, transistors 238, 240 are changed from the conductive state to a non-conductive state. At this time, transistors 226, 228 remain in the conductive state because signal /POR2 is at the H level. A current I2 is larger than a current I1 because the resistance value Rmax of tunneling magneto-resistance element 264 is higher than the resistance value Rmin of tunneling magneto-resistance element 262. Therefore, potentials of the complementary nodes lose their balance such that the potential of node N2 will be lower than that of node N1. Then, the data written in the tunneling magneto-resistance element during a time period t2–t3 will be reflected on potentials of complementary nodes N1, N2 of latch circuit 214 by an amplification operation of cross-coupled inverters in latch circuit 214. With this, the potential of node N1 is set to the H level while the potential of node N2 is set to the L level.

When signal /POR changes from the H level to the L level at time t3, transistors 226, 228 are set to a non-conductive state and memory cell 216 is isolated from latch circuit 214. It is to be noted that, the held value of the latch circuit is always provided to current driver circuits 218, 220 as signals W1, W0 in preparation for the next data saving operation.

As described above, the resistance values of tunneling magneto-resistance elements 262, 264 of memory cell 216 are read as the held data of latch circuit 214.

Figure 18:
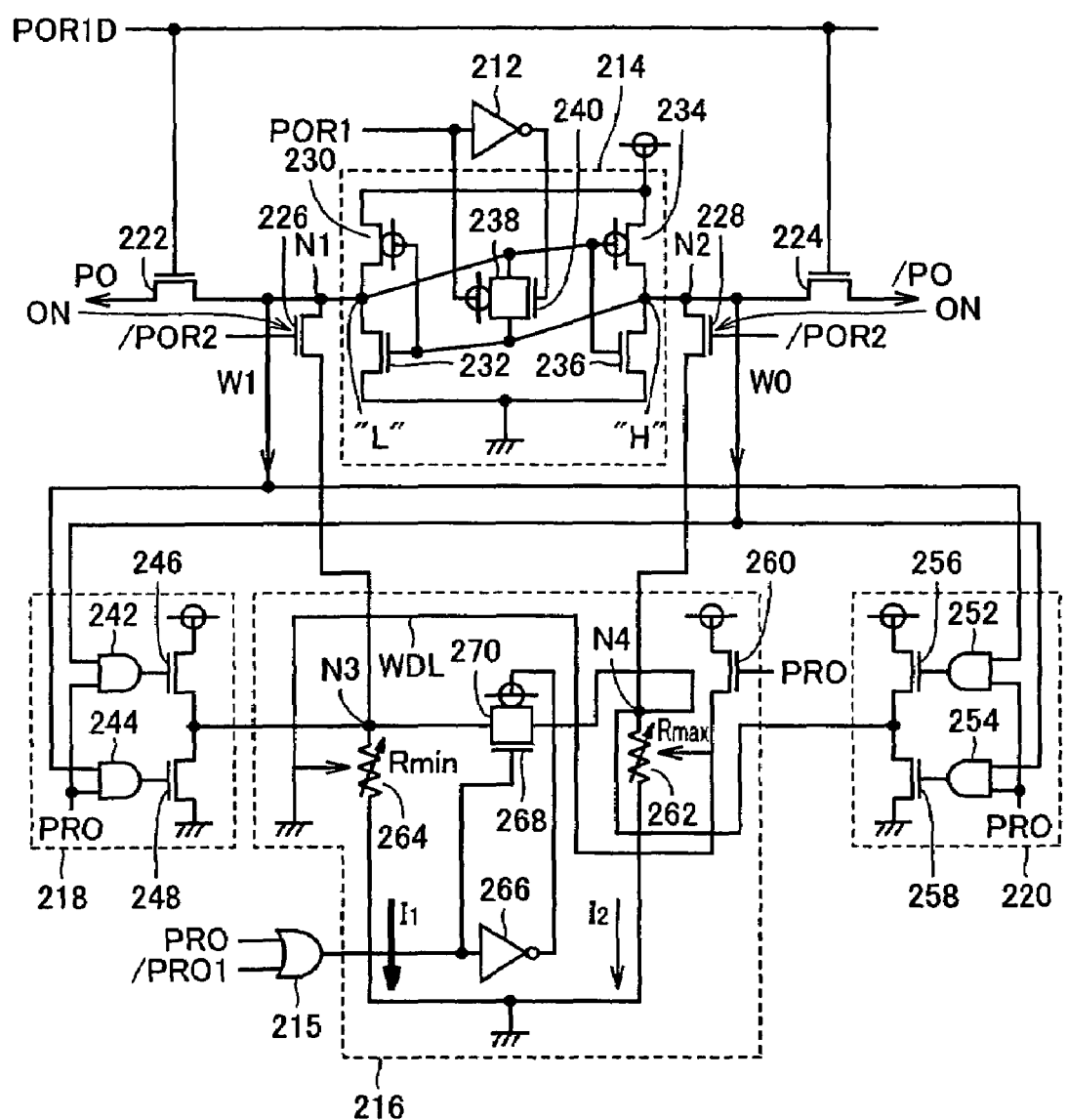
FIG. 18 is a diagram for describing an operation of reading data "0" written in memory cell 216.

FIG. 18 is a diagram for describing an operation of reading data "0" written in memory cell 216.

Referring to FIG. 18, when data "0" is written in memory cell 216, the resistance value of tunneling magneto-resistance element 264 is set to Rmin, while the resistance value of tunneling magneto-resistance element 262 is set to Rmax. In this situation, when transistors 238, 240 are brought into conduction while setting potentials of nodes N1, N2 to the same potential, and when transistors 238, 240 are then set to a non-conductive state, current I1 flowing from node N1 via tunneling magneto-resistance element 264 will be different from current I2 flowing from node N2 via tunneling magneto-resistance element 262. As current I1 is larger than current I2, the potential of node N1 will be slightly lower than that of node N2. Then, the potential of node N1 is set to the L level and that of node N2 is set to the H level by an amplification operation of the cross-coupled inverters of latch circuit 214. After the read operation is ended as such, transistors 226, 228 are set to the non-conductive state and the read operation is completed.

As described above, the write operation can be performed only by activating write signal PRO if the potential of the latch circuit is always provided to current driver circuits 218, 220. With this, processing can be reduced when the power is turned off, and data can be saved in a situation in which the power is instantaneously lowered.

Figure 19:
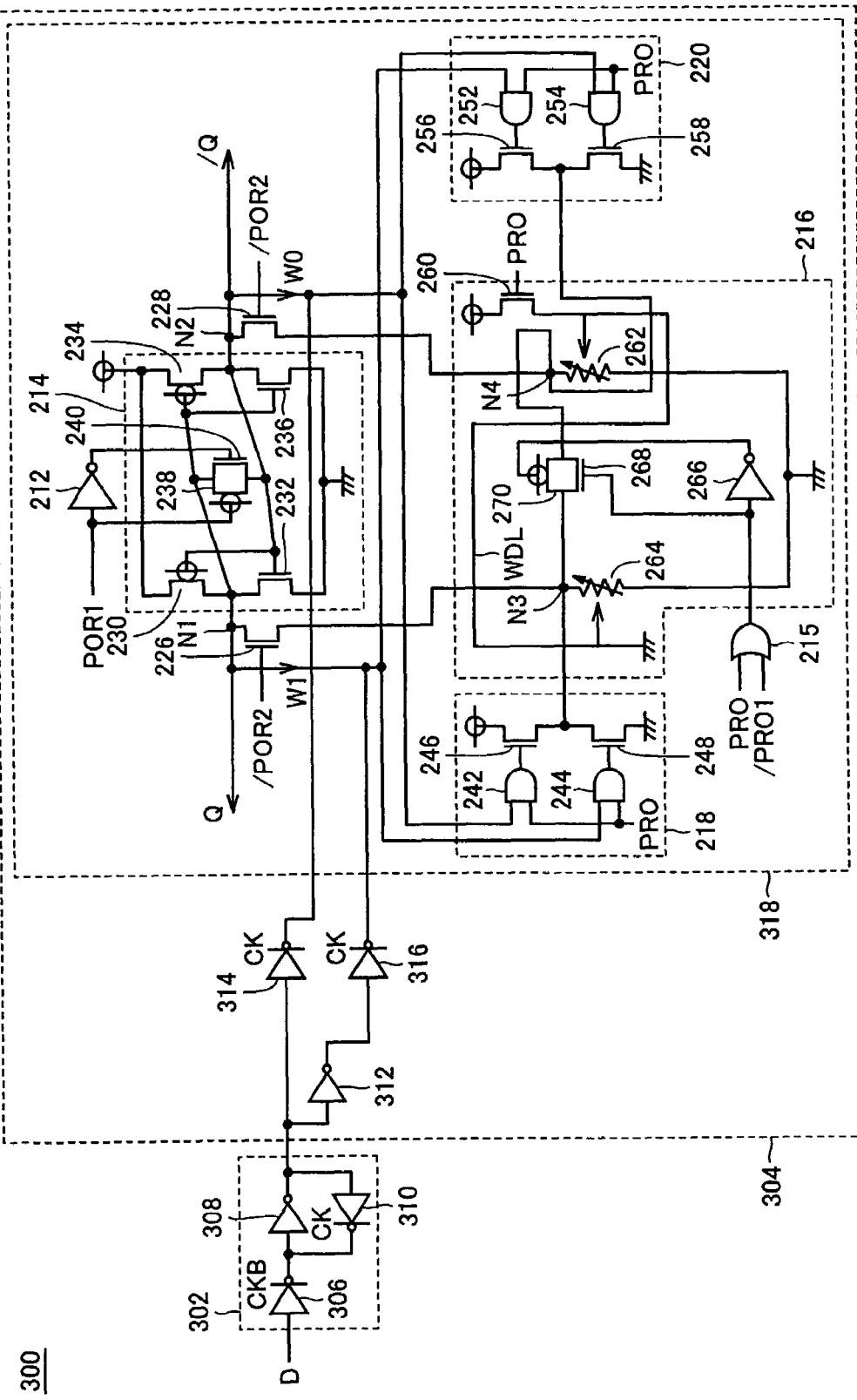
FIG. 19 is a circuit diagram of a structure of a flip-flop 300 applying the structure of data holding circuit 210 shown in FIG. 12.

FIG. 19 is a circuit diagram of a structure of a flip-flop 300 applying the structure of data holding circuit 210 shown in FIG. 12.

Referring to FIG. 19, flip-flop 300 includes a master latch 302 fetching a data signal D in response to clock signals CK, CKB, and a slave latch 304 receiving and holding an output of the master latch in response to clock signal CK.

Master latch 302 includes a clocked inverter 306 inverting data signal D in response to activation of clock signal CKB, an inverter 308 receiving and inverting an output of clocked inverter 306, and a clocked inverter 310 activated in response to clock signal CK to receive and invert an output of inverter 308 and feed the result back to an input of inverter 308.

Slave latch 304 includes an inverter 312 receiving and inverting the output of inverter 308, a clocked inverter 314 activated in response to activation of clock signal CK to receive and invert the output of inverter 308, a clocked inverter 316 activated in response to activation of clock signal CK to receive and invert an output of inverter 312, and a data holding circuit 318 receiving outputs of clocked inverter 314, 316.

Data holding circuit 318 has a structure such that, in the structure of data holding circuit 210 shown in FIG. 12, node N1 is connected to an output of clocked inverter 316 and node N2 is connected to an output of clocked inverter 314. The structure of data holding circuit 318 differs from that of data holding circuit 210 in that, signal Q is output from node N1 while signal /Q is output from node N2, and N channel MOS transistors 222, 224 are eliminated. As structures of other portions of data holding circuit 318 are similar to that of data holding circuit 210, the descriptions thereof will not be repeated.

An output of master latch 302 is converted to a complementary signal by inverter 312 and transmitted to nodes N1, N2 by clocked inverters 314, 316 controlled with clock signal CK. In a normal operation, nodes N1, N2 output output signals Q, /Q of the flip-flop and transmit the potentials of the nodes to a subsequent logic circuit.

As described above, non-volatile memory elements are added to data hold nodes N1, N2 of the master latch of the flip-flop. With this, latch data can be written to a non-volatile memory cell only by activating write signal PRO when the power is turned off, and a time period for saving data can be reduced. In addition, when the power is reset, the latch data can be restored without an additional data transfer time as compared to the first embodiment.

FIG. 20 is an operation waveform diagram for describing a power control operation of semiconductor device 201 shown in FIG. 11.

Referring to FIGS. 11, 20, switch circuit SWA is changed from a non-conductive state to a conductive state at time t1. A power supply potential INTVCCA of circuit block 203A rises at time t1 and, after a while, the data held in the tunneling magneto-resistance element is restored in latch node NA of the data holding circuit included in circuit block 203A.

At time t2, switch circuit SWB is controlled to change from a non-conductive state to a conductive state, and a power supply potential INTVCCB of circuit block 203B rises. Then, the data in the tunneling magneto-resistance element is restored in latch node NB of the data holding circuit included in circuit block 203B.

At time t3, the processing of circuit block 203A is once ended and power control unit 202 activates control signal STA to save the data. In response to the activation of control signal STA, the data is saved from the latch node to the tunneling magneto-resistance element in the data holding circuit included in circuit block 203A. A program current IPA is consumed according to this data saving operation.

When the data write operation is ended, control signal STA is deactivated to the L level at time t4 and, at the same time, switch circuit SWA is set to the non-conductive state and circuit block 203A is set to a standby state.

At time t5, the processing of circuit block 203B is ended and power control unit 202 activates control signal STB to save the data of the data holding circuit included in circuit block 203B. A program current IPB flows accordingly, and the held data of the latch node of the data holding circuit is saved in the tunneling magneto-resistance element.

When the data saving operation of circuit block 203B is ended at time t6, control signal STB is deactivated from the H level to the L level and switch circuit SWB is deactivated. When switch circuit SWA is controlled to be in the conductive state again by power control unit 202 at time t5 in parallel with this processing, the data of latch node NA is restored and the processing is continued in circuit block 203A. Then, control signal STA is activated at time t7 to save a result of the processing, and the data of the latch node of the data holding circuit is written to the tunneling magneto-resistance element.

When the write operation is ended at time t8, control signal STA is deactivated and switch circuit SWA is set to the non-conductive state.

As described above, when the power supply potential is set from an off-state to an on-state, a potential difference generated between the potentials of the complementary nodes in the latch is amplified while a resistance difference of the tunneling magneto-resistance elements is detected in accordance with an increase in the power supply potential of the latch circuit included in each circuit block, and the data is read into the latch circuit.

On the other hand, when the power supply potential is set from an on-state to an off-state, the data of the latch circuit is written with the write current flowing through the tunneling magneto-resistance element according to control signals STA–STD which are generated just before the operation. Because the data saving operation/data restoring operation can be performed at high speed as described above, the power on/off operation can be performed in a short time period and the power consumption can efficiently be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising
a data holding circuit, wherein
said data holding circuit includes
a latch circuit holding data in a volatile manner,
a write control circuit receiving hold information of said latch circuit and an activation signal, and
a thin film magnetic memory cell receiving a current corresponding to said hold information from said write control circuit when said activation signal is in an active state, and rewriting stored data in a non-volatile manner with a magnetic field corresponding to said current.

2. The semiconductor device according to claim 1, wherein
said data holding circuit is a flip-flop circuit performing a data transfer operation in synchronization with a clock signal.

3. The semiconductor device according to claim 1, wherein
said latch circuit includes
a first inverter having an input and an output respectively connected to first and second hold nodes,
a second inverter having an output and an input respectively connected to said first and second hold nodes, and
a switch circuit connecting said first and second hold nodes,
said thin film magnetic memory cell includes
first and second tunneling magneto-resistance elements set to have two complementary resistance values corresponding to said current,
said first tunneling magneto-resistance element is connected on a path from said first hold node to a fixed potential, and
said second tunneling magneto-resistance element is connected on a path from said second hold node to said fixed potential.

* * * * *